US012631484B2

(12) United States Patent
Yoo et al.

(10) Patent No.: US 12,631,484 B2
(45) Date of Patent: May 19, 2026

(54) OPTICAL INSPECTION DEVICE AND OPTICAL INSPECTION METHOD

(71) Applicant: Samsung Display Co., LTD., Yongin-si (KR)

(72) Inventors: Je Won Yoo, Bucheon-si (KR); In Hyuk Kim, Hwaseong-si (KR); Joo Yeol Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 466 days.

(21) Appl. No.: 18/023,326

(22) PCT Filed: Jun. 4, 2021

(86) PCT No.: PCT/KR2021/007006
§ 371 (c)(1),
(2) Date: Aug. 18, 2023

(87) PCT Pub. No.: WO2022/045536
PCT Pub. Date: Mar. 3, 2022

(65) Prior Publication Data
US 2024/0210238 A1     Jun. 27, 2024

(30) Foreign Application Priority Data
Aug. 26, 2020     (KR) ........................ 10-2020-0107530

(51) Int. Cl.
*G01J 1/42*          (2006.01)
*H01L 21/66*         (2006.01)
(Continued)

(52) U.S. Cl.
CPC ............... *G01J 1/42* (2013.01); *H01L 22/12* (2013.01); *H10H 20/80* (2025.01); *G01J 2001/4252* (2013.01)

(58) Field of Classification Search
CPC ....... G01N 21/95; G01M 11/02; H10H 20/01;
H10H 20/80; H01L 22/12; H01L 22/00;
G01J 1/42; G01J 2001/4252
See application file for complete search history.

(56) References Cited

U.S. PATENT DOCUMENTS 7,221,177 B2     5/2007 Komatsu et al.
10,713,985 B2    7/2020 Ju
(Continued)

FOREIGN PATENT DOCUMENTS

CN     1739194 A     2/2006
CN     101750521 A    6/2010
(Continued)

OTHER PUBLICATIONS

Choi Ki-Wook et al (KR 2012/0122192 A), Machine Translation, 2012, pp. 1-10 (Year: 2012).*
(Continued)

*Primary Examiner* — Eman A Alkafawi
*Assistant Examiner* — Suresh K Rajaputra
(74) *Attorney, Agent, or Firm* — Womble Bond Dickinson (US) LLP

(57) ABSTRACT

An optical inspection device includes an optical measurement unit, a first probe under the optical measurement unit and configured to supply a first voltage, a base frame under the optical measurement unit and spaced from the first probe, and a second probe on a surface of the base frame facing the first probe, configured to supply a second voltage different from the first voltage, and having a plate shape in a plan view.

20 Claims, 28 Drawing Sheets

(51) Int. Cl.
    *H01L 33/00*         (2010.01)
    *H10H 20/80*        (2025.01)

(56)               References Cited

U.S. PATENT DOCUMENTS

| | | | |
|---|---|---|---|
| 10,801,969 B1 * | 10/2020 | Yuen | G01N 21/01 |
| 12,100,689 B2 | 9/2024 | Kang et al. | |
| 2010/0013505 A1 | 1/2010 | Takekoshi | |
| 2012/0249776 A1 | 10/2012 | Ji et al. | |
| 2016/0381751 A1 * | 12/2016 | Bong | H05B 45/48 |
| | | | 315/193 |
| 2021/0126158 A1 * | 4/2021 | Kang | H01L 24/95 |
| 2021/0320089 A1 * | 10/2021 | Kang | H01L 25/0753 |

FOREIGN PATENT DOCUMENTS

| | | |
|---|---|---|
| CN | 102735982 A | 10/2012 |
| CN | 109900718 A | 6/2019 |

| | | | | | |
|---|---|---|---|---|---|
| JP | 2006-226829 A | 8/2006 | | | |
| JP | 2013-197340 A | 9/2013 | | | |
| KR | 10-0496468 B1 | 6/2005 | | | |
| KR | 10-0783309 B1 | 12/2007 | | | |
| KR | 10-2009-0039807 A | 4/2009 | | | |
| KR | 10-2010-0071241 A | 6/2010 | | | |
| KR | 10-2012-0114809 A | 10/2012 | | | |
| KR | 10-2012-0122192 A | 11/2012 | | | |
| KR | 20120122192 A | * | 11/2012 | ........... | G02F 1/1309 |
| KR | 10-2014-0074468 A | 6/2014 | | | |
| KR | 2020-0034905 | 4/2020 | | | |
| WO | WO 2010/071276 A1 | 6/2010 | | | |

OTHER PUBLICATIONS

International Search Report for corresponding Application No. PCT/KR2021/007006 dated Sep. 14, 2021, 4pp.

Chinese Office Action dated Jul. 28, 2025 regarding Japanese Patent Application No. 202180053068.4 corresponding to U.S. Appl. No. 18/023,326 (9 pages).

\* cited by examiner

PAD 240
230
220

DR2

DR1

DR3

1000 : 1100,31',ED

1000 : 1100,31',ED

1000 : 1100,31',ED

220_1 : 221,222,223,224,225
PAD_1 : PAD1,PAD2,PAD3,PAD4,PAD5

DR2

DR3 DR1

220_1 : 221,222,223,224,225
PAD_1 : PAD1,PAD2,PAD3,PAD4,PAD5
ED : ED1,ED2,ED3,ED4,ED5,ED6

1000 : 1100,31',ED
ED : ED1,ED3,ED5,ED6

OPTICAL INSPECTION DEVICE AND OPTICAL INSPECTION METHOD

CROSS-REFERENCE TO RELATED APPLICATIONS

This application is a U.S. National Phase Patent Application of International Patent Application Number PCT/KR2021/007006, filed on Jun. 4, 2021, which claims priority to Korean Patent Application Number 10-2020-0107530, filed on Aug. 26, 2020, the entire contents of all of which are incorporated by reference herein.

BACKGROUND

1. Field

The present disclosure relates to an optical inspection device and an optical inspection method.

2. Description of Related Art

The importance of a display device is increasing with the development of multimedia. In response to this, various types of display devices such as an organic light emitting display (OLED) and a liquid crystal display (LCD) are being used.

A device for displaying an image of a display device includes a display panel such as an organic light emitting display panel or a liquid crystal display panel. Among them, the light emitting display panel may include a light emitting device. For example, a light emitting diode (LED) includes an organic light emitting diode (OLED) using an organic material as a light emitting material, and an inorganic light emitting diode using an inorganic material as a light emitting material.

SUMMARY

Aspects and features of embodiments of the present disclosure provide an optical inspection device capable of inspecting optical characteristics of a light emitting element structure including a base substrate and a plurality of light emitting elements formed on the base substrate while reducing or minimizing damage to the light emitting elements.

Aspects and features of embodiments of the present disclosure also provide a method of inspecting optical characteristics of a plurality of light emitting elements using the above optical inspection device.

However, aspects and features of embodiments of the present disclosure are not restricted to the one set forth herein. The above and other aspects of the present disclosure will become more apparent to one of ordinary skill in the art to which the present disclosure pertains by referencing the detailed description of the present disclosure given below.

According to one or more embodiments of the present disclosure, an optical inspection device includes an optical measurement unit, a first probe under the optical measurement unit and configured to supply a first voltage, a base frame under the optical measurement unit and spaced from the first probe, and a second probe on a surface of the base frame facing the first probe, configured to supply a second voltage different from the first voltage, and having a plate shape in a plan view.

The base frame may be located between the optical measurement unit and the first probe and may include a transparent material.

The base frame may include a transparent elastomer.

The optical inspection device may further include a sensor unit configured to sense deformation of the base frame.

The base frame may include a transparent glass substrate.

The second probe may include a transparent conductive material.

The second probe may include a plurality of sub-probes spaced from each other.

The optical inspection device may further include a first probe driver configured to drive the first probe, and a second probe driver configured to drive the second probe.

The optical inspection device may further include a stage under the second probe and configured to have an object to be inspected placed on a surface facing the second probe, and a distance measurement unit configured to measure a distance between the object to be inspected and the second probe.

The optical inspection device may further include a temperature control unit under the stage.

The object to be inspected may include a light emitting element structure including a base substrate, a first semiconductor connection layer on the base substrate, and a plurality of light emitting elements on the first semiconductor connection layer. The first probe is configured to contact the first semiconductor connection layer, and the second probe is configured to contact an end surface of at least one of the plurality of light emitting elements.

The second probe may include a conductive elastomer.

The optical inspection device may further include a sensor unit configured to measure a resistance of the second probe.

According to one or more embodiments of the present disclosure, an optical inspection method of a light emitting element structure includes a base substrate, a first semiconductor connection layer on the base substrate, and a plurality of light emitting elements on the first semiconductor connection layer and spaced from each other. The method includes bringing a first probe in contact with the first semiconductor connection layer and bringing a second probe in contact with an end surface of at least one of the plurality of light emitting elements, transmitting electrical signals to the first probe and the second probe, and inspecting light emitted from the at least one of the plurality of light emitting elements.

Each of the plurality of light emitting elements may include a first semiconductor layer protruding from the first semiconductor connection layer, a second semiconductor layer spaced from the first semiconductor layer, and a light emitting layer interposed between the first semiconductor layer and the second semiconductor layer. The first semiconductor layer, the light emitting layer, and the second semiconductor layer may be sequentially stacked in a direction perpendicular to a surface of the base substrate.

A first probe driver is configured to move the first probe to contact the first semiconductor connection layer, and a second probe driver is configured to move the second probe to contact the end surface of the at least one of the plurality of light emitting elements.

The bringing of the second probe into contact with the end surface of the at least one of the plurality of light emitting elements may include moving the second probe using the second probe driver, determining whether the second probe is in contact with the end surface of the at least one of the plurality of light emitting elements, and stopping the movement of the second probe in case that it is determined that the second probe is in contact with the end surface of the at least one of the plurality of light emitting elements.

The determining of whether the second probe is in contact with the end surface of the at least one of the plurality of light emitting elements may be performed using a distance measurement unit. The distance measurement unit may be configured to measure a distance between the second probe and the end surface of the at least one of the light emitting elements.

The second probe may include a conductive elastomer. The determining of whether the second probe is in contact with the end surface of the at least one of the plurality of light emitting elements may be performed using a sensor unit configured to sense pressure applied to the second probe.

The second probe may include a plate shape in a plan view. The bringing of the second probe to contact with the end surface of the at least one of the plurality of light emitting elements may include placing the second probe to cover the end surface of the at least one of the plurality of light emitting elements.

Other details of the present disclosure are included in the detailed description and the drawings.

An optical inspection device according to one or more embodiments can inspect optical characteristics of a plurality of light emitting elements formed on a base substrate while reducing or minimizing damage to the plurality of light emitting elements.

However, the effects, aspects, and features of embodiments of the present disclosure are not limited to the aforementioned effects, aspects, and features, and various other effects, aspects, and features are included in the present disclosure.

DETAILED DESCRIPTION

Figure 1:
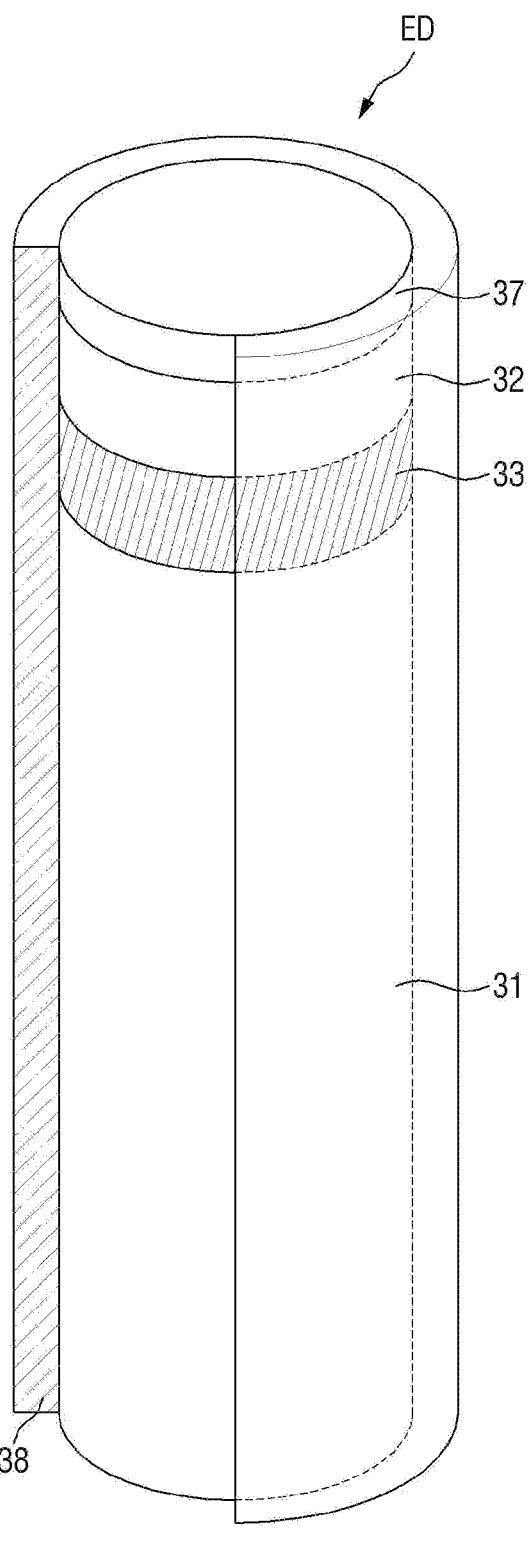
FIG. 1 is a schematic cutaway view of a light emitting element according to one or more embodiments.

Aspects and features of the present disclosure and methods of accomplishing the same may be understood more readily by reference to the following detailed description of example embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the present disclosure to those skilled in the art, and the present disclosure will be defined by the appended claims and their equivalents.

It will be understood that when an element or layer is referred to as being "on" another element or layer, it can be directly on the other element or layer or intervening elements or layers may be present. In contrast, when an element is referred to as being "directly on" another element or layer, there are no intervening elements or layers present.

Throughout the specification, the same or like elements are identified by the same reference characters.

Hereinafter, embodiments of the present disclosure will be described with reference to the drawings.

FIG. 1 is a schematic cutaway view of a light emitting element according to one or more embodiments.

Referring to FIG. 1, the light emitting element ED is a particulate element and may be shaped like a rod or cylinder having a suitable aspect ratio (e.g., a predetermined aspect ratio). A length of the light emitting element ED may be greater than a diameter of the light emitting element ED, and an aspect ratio of the light emitting element ED may be 1.2:1 to 100:1. However, the present disclosure is not limited thereto.

The light emitting element ED may have a nanometer-scale size (1 nm to less than 1 μm) or a micrometer-scale size (1 μm to less than 1 mm). In one or more embodiments, both the diameter and length of the light emitting element ED may have a nanometer-scale size or a micrometer-scale size. In one or more embodiments, the diameter of the light emitting element ED may have a nanometer-scale size, whereas the length of the light emitting element ED has a micrometer-scale size. In one or more embodiments, some light emitting elements ED may have a nanometer-scale size in diameter and/or length, whereas other light emitting elements ED have a micrometer-scale size in diameter and/or length.

In one or more embodiments, the length of the light emitting element ED may be in the range of 1 to 10 μm or 2 to 6 μm or in the range of 3 to 5 μm. In addition, the diameter of the light emitting element ED may be in the range of 30 to 700 nm. However, the present disclosure is not limited thereto, and the light emitting element ED may also have a different diameter depending on the composition of a light emitting layer 33. In one or more embodiments, the diameter of the light emitting element ED may be about 500 nm.

The light emitting element ED may include an inorganic light emitting diode. The inorganic light emitting diode may include a plurality of semiconductor layers. For example, the inorganic light emitting diode may include a first conductivity-type (e.g., n-type) semiconductor layer, a second conductivity-type (e.g., p-type) semiconductor layer, and an active semiconductor layer interposed between them. The active semiconductor layer may receive holes and electrons from the first conductivity-type semiconductor layer and the second conductivity-type semiconductor layer, respectively, and the holes and electrons reaching the active semiconductor layer may combine to emit light.

In one or more embodiments, the above-described semiconductor layers may be sequentially stacked along a longitudinal direction of the light emitting element ED. As illustrated in FIG. 1, the light emitting element ED may include a first semiconductor layer 31, the light emitting layer 33, and a second semiconductor layer 32 sequentially stacked in the longitudinal direction. The first semiconductor layer 31, the light emitting layer 33, and the second semiconductor layer 32 may respectively be the first conductivity-type semiconductor layer, the active semiconductor layer, and the second conductivity-type semiconductor layer described above.

The first semiconductor layer 31 may be doped with a dopant of a first conductivity type. The first conductivity-type dopant may be Si, Ge, or Sn. In one or more embodiments, the first semiconductor layer 31 may be n-GaN doped with n-type Si.

The second semiconductor layer 32 may be spaced from the first semiconductor layer 31 with the light emitting layer 33 interposed between them. The second semiconductor layer 32 may be doped with a dopant of a second conductivity type such as Mg, Zn, Ca, Sr, or Ba. In one or more embodiments, the second semiconductor layer 32 may be p-GaN doped with p-type Mg.

The light emitting layer 33 may include a material having a single or multiple quantum well structure. As described above, the light emitting layer 33 may emit light through combination of electron-hole pairs according to electrical signals received through the first semiconductor layer 31 and the second semiconductor layer 32.

In one or more embodiments, the light emitting layer 33 may have a structure in which a semiconductor material having a large band gap energy and a semiconductor material having a small band gap energy are alternately stacked or may include different Group III to V semiconductor materials depending on the wavelength band of light that it emits.

Light emitted from the light emitting layer 33 may be radiated not only through an outer surface of the light emitting element ED in the longitudinal direction but also through both side surfaces. That is, the direction of light emitted from the light emitting layer 33 is not limited to one direction.

The light emitting element ED may further include an electrode layer 37 disposed on the second semiconductor layer 32. The electrode layer 37 may contact the second semiconductor layer 32. The electrode layer 37 may be an ohmic contact electrode. However, the present disclosure is not limited thereto, and the electrode layer 37 may also be a Schottky contact electrode.

When both ends of the light emitting element ED and electrodes (e.g., contact electrodes of a display device or first and second probes of an optical inspection device) are electrically connected to transmit electrical signals to the first semiconductor layer 31 and the second semiconductor layer 32, the electrode layer 37 may be disposed between the second semiconductor layer 32 and the electrodes to reduce the resistance between them. The electrode layer 37 may include at least one selected from among aluminum (Al), titanium (Ti), indium (In), gold (Au), silver (Ag), indium tin oxide (ITO), indium zinc oxide (IZO), and indium tin-zinc oxide (ITZO). The electrode layer 37 may also include an n-type or p-type doped semiconductor material.

The light emitting element ED may further include an insulating film 38 covering outer surfaces (e.g., outer peripheral or circumferential surfaces) of the first semiconductor layer 31, the second semiconductor layer 32, the light emitting layer 33, and/or the electrode layer 37. The insulating film 38 may be around (e.g., may surround) an outer surface (e.g., an outer peripheral or circumferential surface) of at least the light emitting layer 33 and extend in a direction in which the light emitting element ED extends. The insulating film 38 may protect the above members. The insulating film 38 may be made of an insulating material to prevent an electrical short circuit that may occur when the light emitting layer 33 directly contacts an electrode that transmits an electrical signal to the light emitting element ED. In addition, because the insulating film 38 protects the outer surfaces (e.g., outer peripheral or circumferential surfaces) of the first and second semiconductor layers 31 and 32 as well as the light emitting layer 33, a reduction in luminous efficiency can be prevented.

Figure 2:
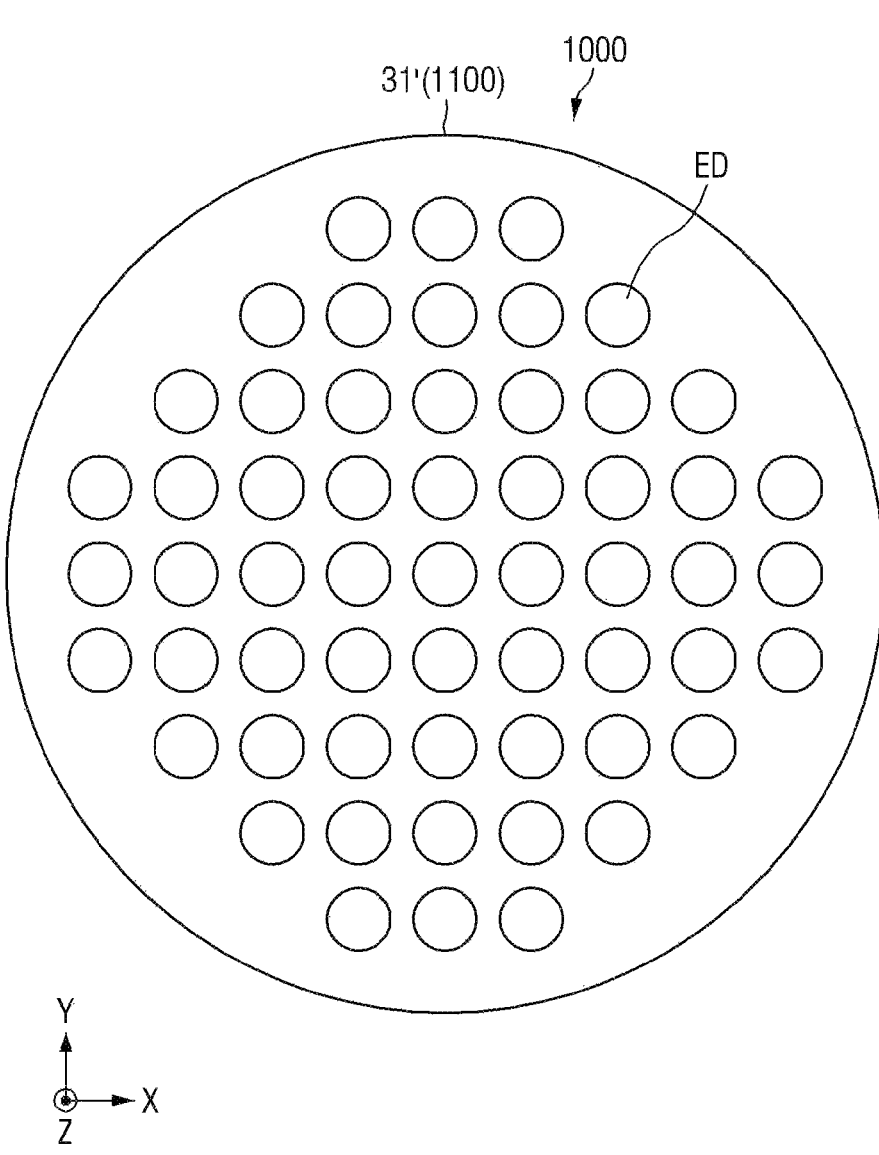
FIG. 2 is a plan view of a light emitting element structure according to one or more embodiments.
Figure 3:
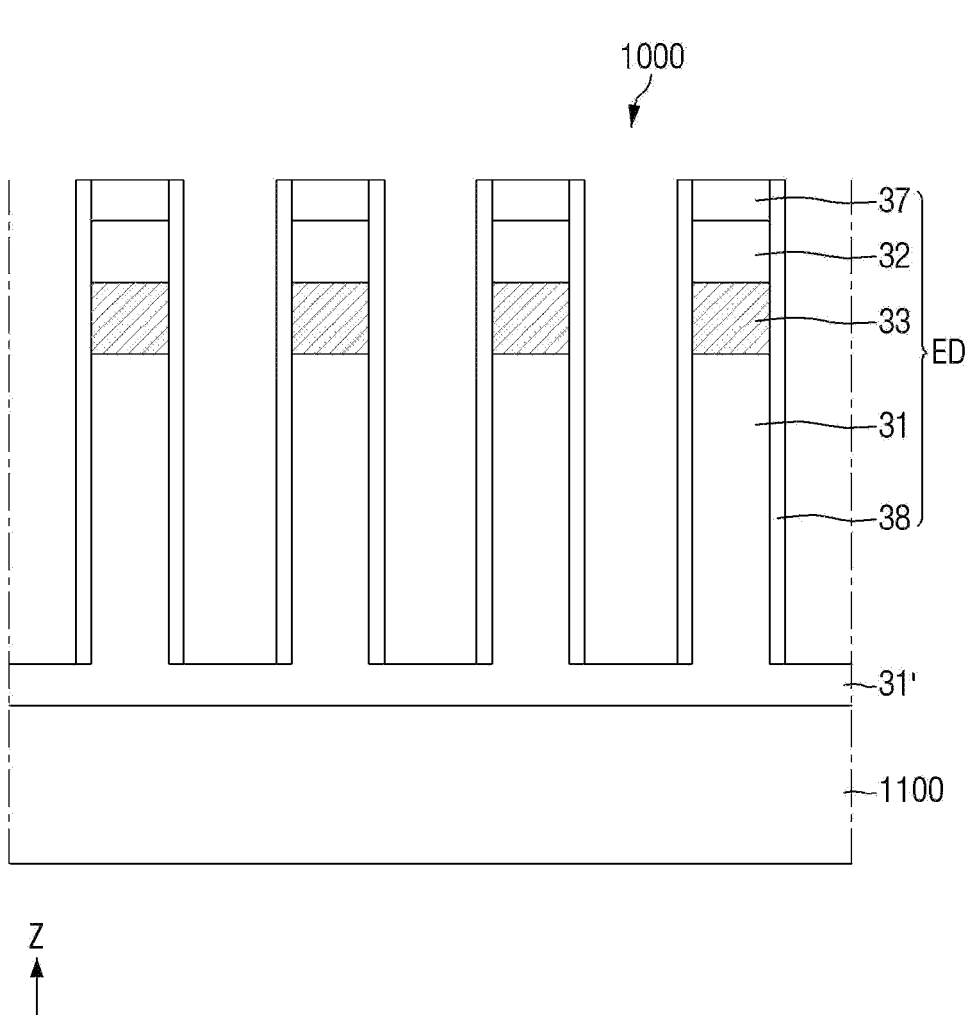
FIG. 3 is a cross-sectional view of the light emitting element structure according to one or more embodiments.
Figure 4:
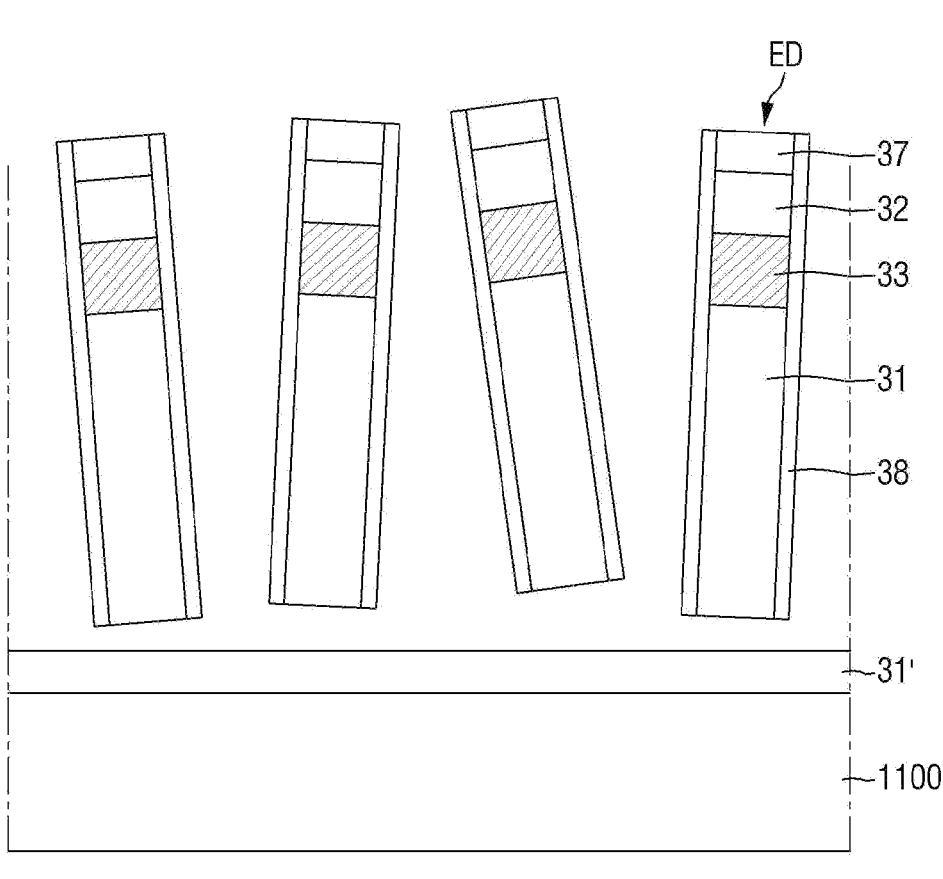
FIG. 4 is a cross-sectional view illustrating a part of a process of manufacturing light emitting elements from the light emitting element structure according to one or more embodiments.

FIG. 2 is a plan view of a light emitting element structure according to one or more embodiments. FIG. 3 is a cross-sectional view of the light emitting element structure according to one or more embodiments. FIG. 4 is a cross-sectional view illustrating a part of a process of manufacturing light emitting elements from the light emitting element structure according to one or more embodiments.

In some accompanying drawings, an X-axis direction X, a Y-axis direction Y, and a Z-axis direction Z are defined. The X-axis direction X and the Y-axis direction Y are located on one plane and are orthogonal to each other, and the Z-axis direction Z is perpendicular to each of the X-axis direction X and the Y-axis direction Y. It may be understood that the X-axis direction X indicates a right side in a plan view, the Y-axis direction Y indicates an upper side in a plan view, and the Z-axis direction Z indicates an upper side in cross section.

Referring to FIGS. 2 and 3, the light emitting element structure 1000 may include a base substrate 1100, a first semiconductor connection layer 31' disposed on the base substrate 1100, and a plurality of light emitting elements ED formed on the first semiconductor connection layer 31'.

The base substrate 1100 may include a sapphire substrate (AlOx) or a transparent substrate such as glass. However, the present disclosure is not limited thereto, and the base substrate 1100 may also be made of a conductive substrate such as GaN, SiC, ZnO, Si, GaP, and GaAs. In one or more embodiments, the base substrate 1100 may be a sapphire substrate (AlOx).

The first semiconductor connection layer 31' may be disposed on the base substrate 1100. The first semiconductor connection layer 31' may include the same material as the first semiconductor layer 31 of each light emitting element ED. That is, when the first semiconductor layer 31 is n-GaN doped with n-type Si, the first semiconductor connection layer 31' may also be n-GaN doped with n-type Si.

Although the first semiconductor connection layer 31' is directly disposed on a surface of the base substrate 1100 in the drawings, the present disclosure is not limited thereto, and another material layer such as a buffer material layer may also be disposed between the first semiconductor connection layer 31' and the base substrate 1100. The buffer material layer may reduce a difference in lattice constant between the base substrate 1100 and the first semiconductor connection layer 31'. The buffer material layer may include an undoped semiconductor. The buffer material layer may include the same material as the first semiconductor layer 31, but may include a material not doped with an n-type or a p-type.

The light emitting elements ED may be formed on the first semiconductor connection layer 31'. The light emitting elements ED may be spaced from each other on the first semiconductor connection layer 31'. In a space between the light emitting elements ED, the first semiconductor connection layer 31' may be exposed in an upward direction (e.g., in the Z-axis direction Z) without being covered by the insulating film 38.

In each light emitting element ED, the first semiconductor layer 31, the light emitting layer 33, the second semiconductor layer 32, and the electrode layer 37 may be sequentially stacked on the first semiconductor connection layer 31' in the upward direction (Z-axis direction Z). As described above, the insulating film 38 may be around (e.g., may surround) the outer surfaces (e.g., the outer peripheral or circumferential surfaces) of the first semiconductor layer 31, the light emitting layer 33, the second semiconductor layer 32, and the electrode layer 37. The structure of each light emitting element ED is the same as that described with reference to FIG. 1 except that the light emitting elements ED are connected to the first semiconductor connection layer 31'. Thus, any redundant description will be omitted, and differences will be mainly described.

The first semiconductor layer 31 may be integrated with the first semiconductor connection layer 31'. The first semiconductor layer 31 may protrude in the upward direction (Z-axis direction) from the first semiconductor connection layer 31' disposed on the entire surface of the base substrate 1100. That is, the first semiconductor layer 31 and the first semiconductor connection layer 31' may include the same material and may be formed integrally with each other, but may have different steps. Therefore, the first semiconductor layers 31 of the light emitting elements ED formed on the first semiconductor connection layer 31' may be integrated with the first semiconductor connection layer 31' and thus physically and/or electrically connected to each other. This structure may be formed in a process of manufacturing the light emitting element structure 1000.

The light emitting element structure 1000 may be manufactured by an epitaxial growth method. Specifically, the light emitting element structure 1000 may be formed by forming a seed crystal layer for forming a semiconductor layer on the base substrate 1100, depositing and growing a desired semiconductor material, and then etching the semiconductor material. That is, a first semiconductor layer material layer, a light emitting layer material layer, a second semiconductor layer material layer, and an electrode layer material layer may be sequentially formed on the base substrate 1100 through semiconductor material deposition and then may be vertically etched in a thickness direction, e.g., the Z-axis direction Z of the base substrate 1100 to form the patterned first semiconductor layers 31, light emitting layers 33, second semiconductor layers 32, and electrode layers 37. In this case, the first semiconductor layer material layer may be etched to remain on the base substrate 1100 to a certain thickness. Through this etching method, the first semiconductor layers 31 of the light emitting elements ED and the first semiconductor connection layer 31' connecting the first semiconductor layers 31 to each other may be formed. Next, the insulating film 38 is formed to be around (e.g., to surround) the outer surfaces (e.g., the outer peripheral or circumferential surfaces) of the first semiconductor layers 31, the light emitting layers 33, the second semiconductor layers 32 and the electrode layers 37. Accordingly, the light emitting element structure 1000 in which a plurality of light emitting elements ED are formed may be manufactured.

Referring to FIG. 4, after the light emitting element structure 1000 is formed, the light emitting elements ED may be separated from the base substrate 1100 and the first semiconductor connection layer 31' formed on the base substrate 1100. The process of separating the light emitting elements ED from the base substrate 1100 and the first semiconductor connection layer 31' formed on the base substrate 1100 may be performed by a physical separation method or a chemical separation method.

Some of the light emitting elements ED formed on the base substrate 1100 may be defective for reasons such as poor growth of semiconductor crystals during a manufacturing process. Once the light emitting elements ED are separated from the base substrate 1100, it is not easy to check the light emitting elements ED one by one for detects because the light emitting elements ED are only nanometers to micrometers in size. If it is possible to identify whether each of the light emitting elements ED is defective before separating the light emitting elements ED formed on the base substrate 1100 from the base substrate 1100, defective light emitting elements ED can be excluded in advance, thus reducing a defect rate of a display device. Whether the light emitting elements ED are defective may be checked by measuring electrical or optical characteristics of the light emitting element structure 1000 in a state where the light emitting elements ED are coupled to the base substrate 1100. Measuring the electrical/optical characteristics of the light emitting element structure 1000 including a group of light emitting elements ED using an optical inspection device to be described below is more effective and easier than measuring characteristics of each separated, individual light emitting element ED.

Figure 5:
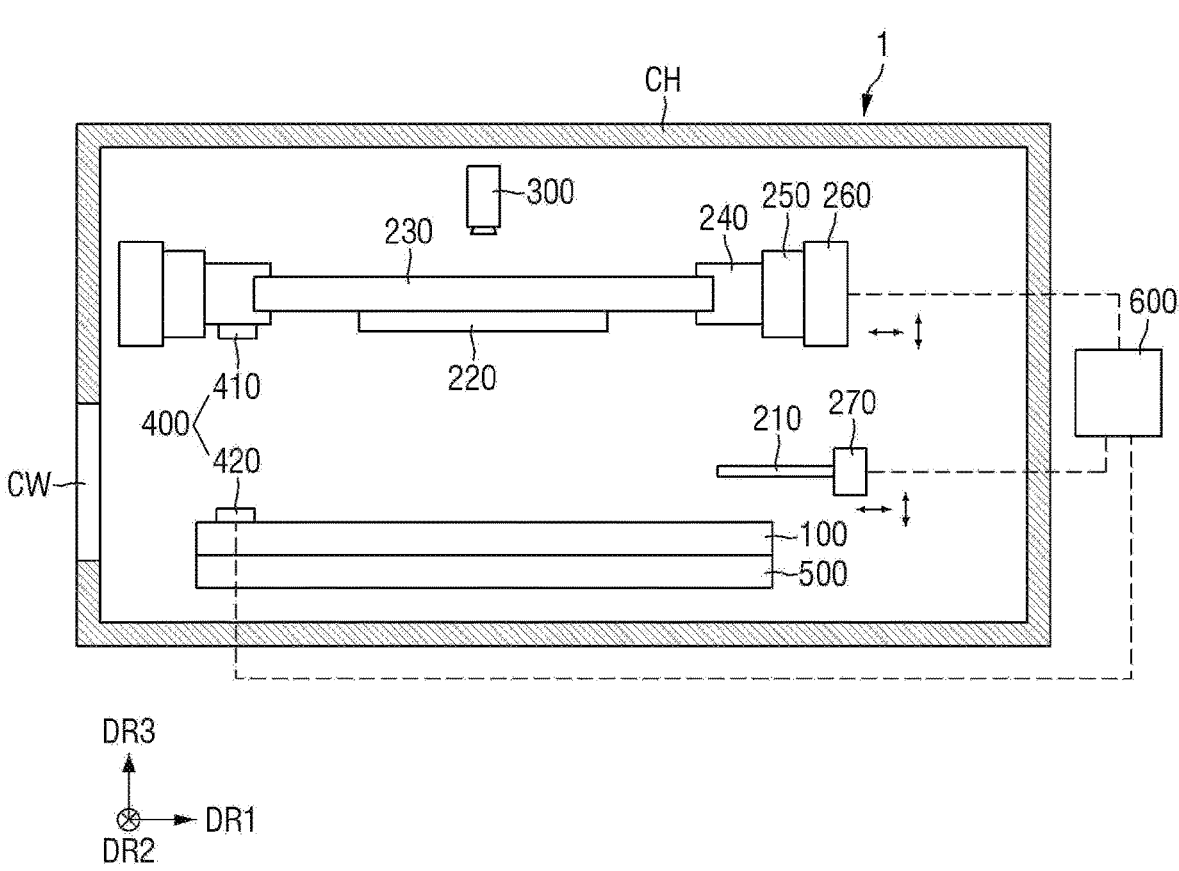
FIG. 5 is a structural diagram of an optical inspection device according to one or more embodiments.
Figure 6:
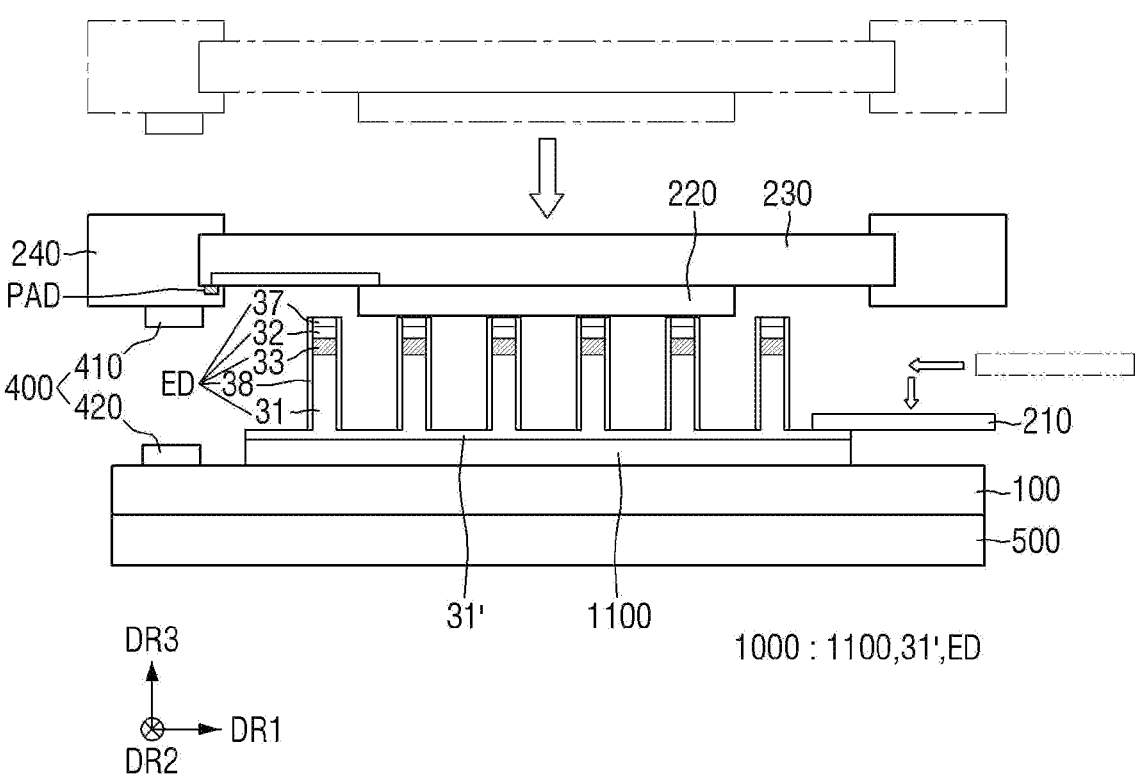
FIG. 6 is a schematic diagram illustrating the operation of first and second probes according to one or more embodiments.

FIG. 5 is a structural diagram of an optical inspection device according to one or more embodiments. FIG. 6 is a schematic diagram illustrating the operation of first and second probes according to one or more embodiments.

Referring to FIGS. 5 and 6, the optical inspection device 1 according to one or more embodiments may include a chamber CH, a stage 100, the first probe 210, the second probe 220, probe drivers 250, 260, and 270, an optical measurement unit 300, a distance measurement unit 400 (410, 420), a temperature control unit 500, and a control unit 600. The optical inspection device 1 may further include a base frame 230 on which the second probe 220 is disposed and a support 240 which supports the base frame.

The optical inspection device 1 according to one or more embodiments may be a device for inspecting optical characteristics of at least one light emitting element ED. For example, the optical inspection device 1 may inspect optical characteristics of a plurality of light emitting elements ED described above in a state where the light emitting elements ED are formed on the base substrate 1100 without being separated from the base substrate 1100, that is, in the state of the light emitting element structure 1000. However, the present disclosure is not limited thereto, and the optical inspection device 1 may also inspect the optical character-istics of the light emitting elements ED separated from the base substrate 1100 of the light emitting element structure 1000. A case where the optical characteristics of the light emitting elements ED formed on the base substrate 1100 are inspected in a state where the light emitting elements ED are not separated from the base substrate 1100 will be mainly described below.

In the drawings for explaining the optical inspection device 1, a first direction DR1, a second direction DR2, and a third direction DR3 are defined. The first direction DR1 and the second direction DR2 may be perpendicular to each other in one plane. The third direction DR3 may be perpen-dicular to the plane in which the first direction DR1 and the second direction DR2 are located. The third direction DR3 is perpendicular to each of the first direction DR1 and the second direction DR2. In the embodiment describing the optical inspection device 1, the third direction DR3 indicates a direction in which the optical measurement unit 300 is disposed with respect to the stage 100.

The chamber CH may provide a space in which an optical inspection process is performed. In addition, the chamber CH may block external light during the optical inspection process. For example, the chamber CH may be a dark room. Because the chamber CH is provided as a dark room that blocks external light, it is not affected by the external light during the optical inspection process. Therefore, the accu-racy of inspecting optical characteristics of light emitted from the light emitting elements ED can be improved.

An opening CW through which an optical inspection target (e.g., the light emitting element structure 1000) is carried in or out may be disposed at a side of the chamber CH. The opening CW may provide a path through which the optical inspection target (e.g., the light emitting element structure 1000) is inserted or removed.

The stage 100 may be disposed inside the chamber CH. The stage 100 provides a space in which the optical inspec-tion target (e.g., the light emitting element structure 1000) is placed. The light emitting element structure 1000 may be placed and fixed on the stage 100 while the optical inspec-tion process is performed. The stage 100 may include an electrostatic chuck for fixing the optical light emitting element structure 1000.

The optical measurement unit 300 may be disposed above the stage 100.

The optical measurement unit 300 may be spaced from the stage 100 by a suitable distance (e.g., a predetermined distance). The optical measurement unit 300 may be disposed above the stage 100 to inspect or measure optical characteristics of light travelling upward after being emitted from the light emitting elements ED of the light emitting element structure 1000. For example, the optical measure-ment unit 300 may sense light emitted from each light emitting element ED and measure an optical characteristic value of the sensed light. Here, the 'optical characteristic value' may include the luminance of the sensed light or the wavelength of the sensed light. The optical measurement unit 300 may include a spectrometer, a high-resolution camera, and the like.

The first and second probes 210 and 220 may be disposed between the stage 100 and the optical measurement unit 300. The first and second probes 210 and 220 may be respectively spaced from the stage 100 and the optical measurement unit 300 in the chamber CH.

The first probe 210 and the second probe 220 may be spaced from each other. The first and second probes 210 and 220 may transmit electrical signals to the light emitting element structure 1000 prepared on the stage 100.

The first probe 210 may be disposed adjacent to the stage 100. When the light emitting element structure 1000 is prepared on the stage 100, the first probe 210 may contact the light emitting element structure 1000 to provide a first voltage to the light emitting element structure 1000. Spe-cifically, the first probe 210 may contact the first semicon-ductor connection layer 31' of the light emitting element structure 1000 to provide the first voltage to the first semi-conductor connection layer 31'.

A first probe driver 270 may be connected to the first probe 210 to move the first probe 210. The first probe driver 270 may be connected to the first probe 210 to move the first probe 210 in horizontal and vertical directions, for example, in the first and second directions DR1 and DR2, which are horizontal directions, and in the third direction DR3, which is a vertical direction. The first probe 210 may be connected to or separated from the light emitting element structure 1000 by the driving of the first probe driver 270. During the optical inspection process, the first probe driver 270 may be driven to make the first probe 210 contact the light emitting element structure 1000 and provide the first voltage. In other operations, the first probe driver 270 may be driven again to separate the first probe 210 from the light emitting element structure 1000.

The second probe 220 may be disposed above the stage 100 (i.e., in the third direction DR3) and spaced from the stage 100. The second probe 220 may be disposed on a surface of the base frame 230 that faces the stage 100. The base frame 230 may be mounted on the support 240.

The second probe 220 may contact the light emitting element structure 1000 to provide a second voltage to the light emitting element structure 1000. Specifically, the sec-ond probe 220 may contact an end surface of each of at least some of the light emitting elements ED of the light emitting element structure 1000 to provide the second voltage to the light emitting elements ED. The end surface of each light emitting element in contact with the second probe 220 may be an upper surface of the electrode layer 37 of the light emitting element ED.

Second probe drivers 250 and 260 may move the second probe 220. The second probe drivers 250 and 260 may be connected to the base frame 230 and the support 240, on which the second probe 220 is disposed, to move the second probe 220 in the horizontal and vertical directions, for example, in the first and second directions DR1 and DR2, which are horizontal directions, and in the third direction DR3, which is a vertical direction. The second probe 220 may be connected to the second probe drivers 250 and 260 and may be connected to or separated from the light emitting element structure 1000 by the second probe drivers 250 and 260.

The second probe drivers 250 and 260 may include a first sub-driver 250 and a second sub-driver 260. The first sub-driver 250 and the second sub-driver 260 may drive the second probe 220 but may be different from each other in a driving method and/or a driving range. For example, the first sub-driver 250 may be driven by a servo method, and the second sub-driver 260 may be driven by a piezo method. One driving range of the first sub-driver 250 may include a range of 250 nm or less, and one driving range of the second sub-driver 260 may include a range of 10 nm or less. Because the first sub-driver 250 and the second sub-driver 260 having different driving ranges are included, the movement range of the second probe 220 can be finely adjusted. Therefore, the second probe 220 and the light emitting element structure 1000 can be brought into contact with each other without damage to the light emitting element structure 1000.

The distance measurement unit 400 may measure a distance between the second probe 220 and the light emitting element structure 1000. The distance measurement unit 400 may measure the distance between the second probe 220 and the light emitting element structure 1000 and transmit the measured distance data to the control unit 600. The second probe drivers 250 and 260 may be driven according to the distance data between the second probe 220 and the light emitting element structure 1000 from the distance measurement unit 400 to control the position of the second probe 220. The distance measurement unit 400 is not particularly limited as long as it can measure the distance between the second probe 220 and the light emitting element structure 1000.

The distance measurement unit 400 may include a light irradiation unit 410 and a first sensor unit 420.

The light irradiation unit 410 may be disposed above the stage 100 and spaced apart from the stage 100 in the third direction DR3. The light irradiation unit 410 may be disposed on a surface of the support 240 that faces the stage 100, for example, on a lower surface of the support 240. The light irradiation unit 410 may emit inspection light to measure the distance between the second probe 220 and the light emitting element structure 1000.

The first sensor unit 420 may be disposed on a surface of the stage 100. The first sensor unit 420 may be disposed under the light irradiation unit 410 and spaced from the light irradiation unit 410 in the third direction DR3. The first sensor unit 420 may measure the distance between the second probe 220 and the light emitting element structure 1000 by sensing the inspection light emitted from the light irradiation unit 410. The first sensor unit 420 may measure the distance between the second probe 220 and the light emitting element structure 1000 and transmit the measured distance data to the control unit 600.

The light irradiation unit 410 and the first sensor unit 420 of the distance measurement unit 400 will be described in detail later with reference to other drawings.

The control unit 600 may control the operation of the first probe driver 270 and the second probe drivers 250 and 260. The control unit 600 may control the operation of the second probe drivers 250 and 260 based on the distance data between the second probe 220 and the light emitting element structure 1000 received from the first sensor unit 420 of the distance measurement unit 400. The control unit 600 may bring the first and second probes 210 and 220 and the light emitting element structure 1000 into contact with each other by controlling the operation of the first probe driver 270 and the second probe drivers 250 and 260.

The temperature control unit 500 may adjust the temperature inside the chamber CH or the temperature on the stage 100. Specifically, when the light emitting elements ED emit light while the optical inspection process is performed on the light emitting element structure 1000, heat may be generated, and the light emitting elements ED may be damaged by the heat. Therefore, the temperature control unit 500 may prevent the heat generated from the light emitting elements ED from damaging the light emitting elements ED by indirectly adjusting the temperature inside the chamber CH or the temperature on the stage 100.

In one or more embodiments, the temperature control unit 500 may be disposed under the stage 100. The temperature control unit 500 may be disposed under the stage 100 to cool the stage 100. Because the temperature control unit 500 is disposed under the stage 100 to cool the stage 100, it is possible to prevent the temperature of the light emitting elements ED from being increased by the heat generated from the light emitting element structure 1000. The temperature control unit 500 may include an air-cooled or water-cooled heat dissipation device or a Peltier device as a cooling device. Although the temperature control unit 500 is disposed under the stage 100 in the drawings, the present disclosure is not limited thereto. For example, the temperature control unit 500 may also include a cooling device spaced from the stage 100 to control the temperature inside the chamber CH.

As described above, each of the light emitting elements ED that are spaced from each other on the base substrate 1100 may be shaped like a rod or cylinder having a suitable aspect ratio (e.g., a predetermined aspect ratio). Because the length of each light emitting element ED in the extending direction of the light emitting element ED is greater than the diameter of the light emitting element ED, when an external force acts on the light emitting elements ED formed on the base substrate 1100, the light emitting elements ED may be damaged. By including the distance measurement unit 400 and the first and second probe drivers 250, 260, and 270, the optical inspection device 1 according to the current embodiment can prevent the light emitting elements ED from being damaged by an external force when the first and second probes 210 and 220 are brought into contact with the light emitting element structure 1000. In addition, by including the temperature control unit 500, the optical inspection device 1 according to the current embodiment can reduce heat energy that may be generated by light emission of the light emitting elements ED, thereby preventing the light emitting elements ED from being damaged by the heat. That is, it is possible to inspect the optical characteristics of the light emitting elements ED in the state of the light emitting element structure 1000 while reducing or minimizing damage to the light emitting elements ED.

The operation of each member of the optical inspection device 1 will now be described in detail.

Figure 7:
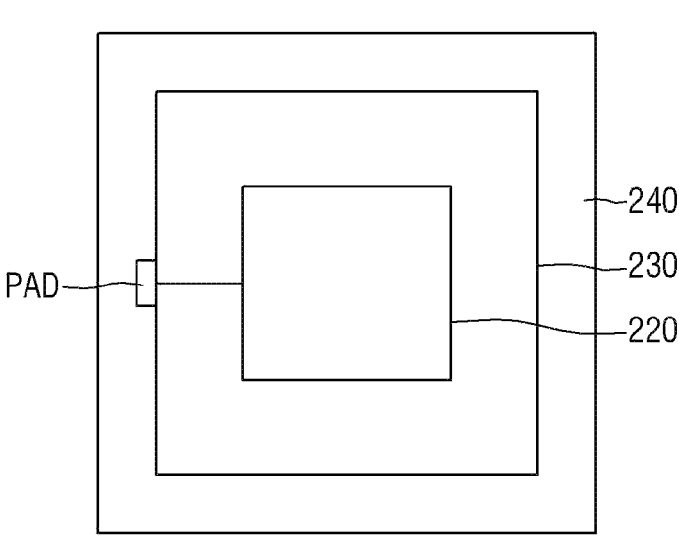
FIG. 7 is a bottom view illustrating the relative arrangement of a support, a base frame, and the second probe according to one or more embodiments.
Figure 7:
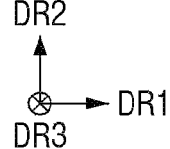

FIG. 7 is a bottom view illustrating the relative arrangement of the support, the base frame, and the second probe according to one or more embodiments.

Referring to FIGS. 5 through 7, the light emitting element structure 1000 may be mounted on the stage 100. Specifically, the light emitting element structure 1000 may be prepared on an upper surface of the stage 100 such that the light emitting elements ED of the light emitting element structure 1000 face upward. Accordingly, the electrode layer 37 of each of the light emitting elements ED included in the light emitting element structure 1000 on the stage 100 may face upward, and the first semiconductor layer 31 and the first semiconductor connection layer 31' may face downward.

When the light emitting element structure 1000 is prepared on the stage 100, the first probe 210 may be moved by the first probe driver 270 to contact the light emitting element structure 1000. As described above, the first probe 210 may be moved in the horizontal and vertical directions by the first probe driver 270, and the first probe driver 270 may move the first probe 210 to bring the first probe 210 into contact with the first semiconductor connection layer 31' of the light emitting element structure 1000. The first probe 210 may contact the first semiconductor connection layer 31' to transmit the first voltage received from a voltage applying device to the first semiconductor connection layer 31'. As described above, the first semiconductor connection layer 31' may be formed integrally with each of the first semiconductor layers 31 of the light emitting elements ED included in the light emitting element structure 1000 to transmit an electrical signal, for example, the first voltage received from the first probe 210 to each of the first semiconductor layers 31 of the light emitting elements ED.

The base frame 230 may be fixed to the support 240 in the chamber CH. The base frame 230 may include a quadrilateral shape in a plan view. Although the base frame 230 has a square planar shape in the drawings, the present disclosure is not limited thereto. The base frame 230 may also have various planar shapes such as a circular shape and a rectangular shape.

The base frame 230 may include a substrate made of a transparent material. Because the base frame 230 includes a substrate made of a transparent material, light emitted from the light emitting elements ED of the light emitting element structure 1000 may pass through the base frame 230 and travel to the optical measurement unit 300 disposed above the base frame 230.

In one or more embodiments, the base frame 230 may include a transparent flexible substrate. The base frame 230 may include a material that is deformed by a force or stimulus applied from the outside. For example, the base frame 230 may include a transparent elastomer. For example, the transparent elastomer may be, but is not limited to, silicone rubber, urethane rubber, acrylic rubber, styrene-butadiene rubber, flexible polyvinyl chloride, ethylene-propylene copolymer, ethylene-butene copolymer, or ethylene-vinyl acetate copolymer.

Because the base frame 230 includes the transparent elastic polymer, it may be deformed by a force or stimulus applied from the outside. Therefore, the base frame 230 including the transparent elastic polymer may cushion the impact that may occur when the second probe 220 moves to contact the light emitting elements ED of the light emitting element structure 1000 and may prevent the light emitting elements ED from being damaged by external impact.

In one or more embodiments, the base frame 230 may include a transparent rigid substrate. For example, the base frame 230 may include a transparent material such as glass or quartz or may include a polymer material such as polyimide.

The support 240 may support the base frame 230. The support 240 may include a square closed loop shape. The support 240 may be around (e.g., may (surround) the base frame 230 to fix and/or support the base frame 230. The support 240 may be connected to the second probe drivers 250 and 260 for moving the second probe 220 and/or the control unit 600 for controlling the moving speed or direction of the second probe drivers 250 and 260.

A probe pad PAD may be further disposed on a lower surface of the base frame 230. The probe pad PAD may be electrically connected to the second probe 220 and may be connected to a separate voltage applying device. The probe pad PAD may transmit an electrical signal received from the voltage applying device to the second probe 220.

The second probe 220 may be disposed on a surface of the base frame 230 that faces the stage 100, that is, on the lower surface of the base frame 230. The second probe 220 may be disposed in the center of the base frame 230 in a plan view.

When the light emitting element structure 1000 is placed on the stage 100, the second probe 220 may be moved by the second probe drivers 250 and 260 to contact upper surfaces of at least some of the light emitting elements ED included in the light emitting element structure 1000. Specifically, the second probe 220 may be moved by the second probe drivers 250 and 260 so that a lower surface of the second probe 220 contacts the upper surfaces of the electrode layers 37 of at least some of the light emitting elements ED. The second probe 220 may contact the upper surfaces of the light emitting elements ED to transmit the second voltage to an end of each of the light emitting elements ED. Specifically, the second probe 220 may contact the electrode layer 37 disposed in an upper portion of each of the light emitting elements ED.

The second probe 220 may have a plate shape in a plan view. The second probe 220 may have a plate shape to cover at least some of the light emitting elements ED included in the light emitting element structure 1000. Although the planar shape of the second probe 220 is a square shape having the same length in the first direction DR1 and the second direction DR2, the present disclosure is not limited thereto. For example, the second probe 220 may also have other planar shapes such as a circular shape and a rectangular shape.

The second probe 220 may include a transparent conductive material. Because the second probe 220 includes a transparent conductive material, light emitted from the light emitting elements ED of the light emitting element structure 1000 may pass through the second probe 220 and travel to the optical measurement unit 300 disposed above the second probe 220. For example, the second probe 220 may include a material such as, but not limited to, indium tin oxide (ITO), indium zinc oxide (IZO), indium tin-zinc oxide (ITZO), Ag NW, or conductive polymer PEDOT/PSS.

Figure 8:
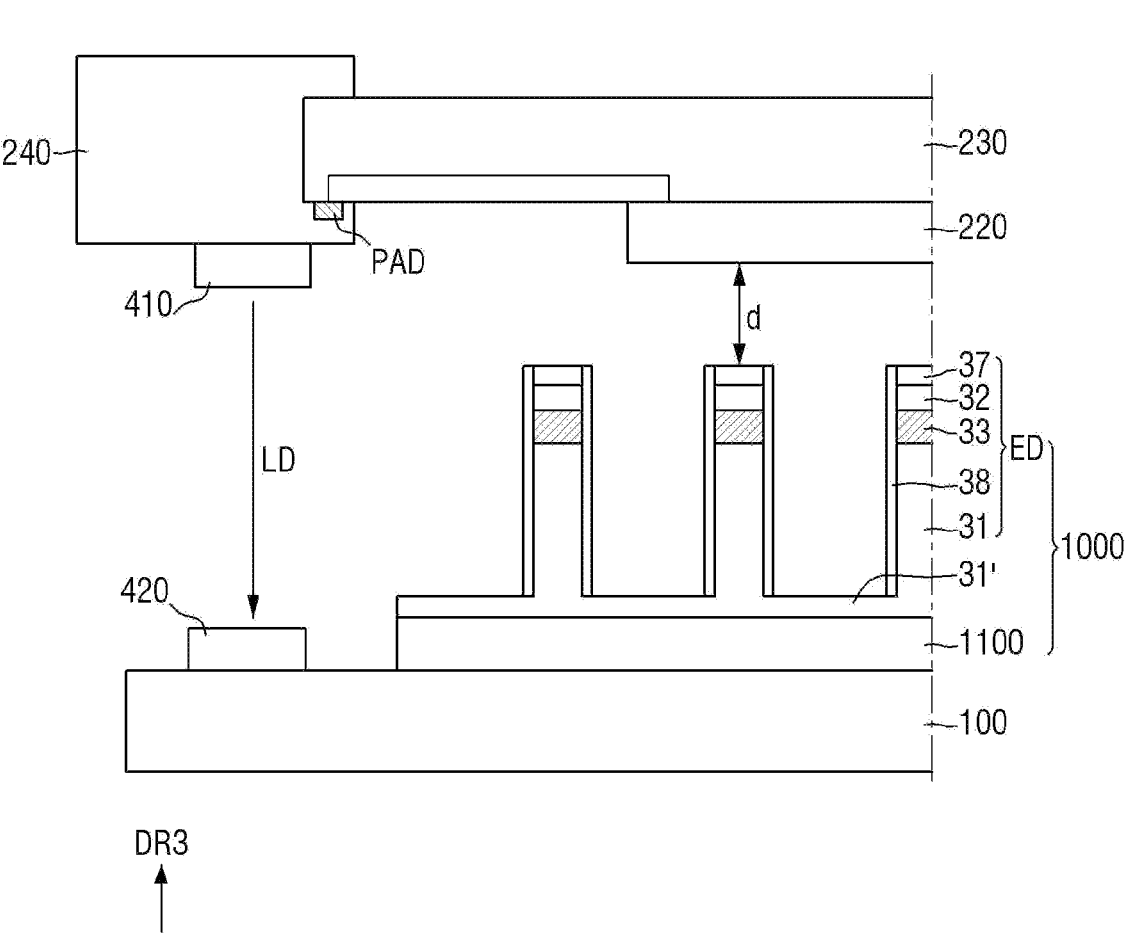
FIG. 8 is a schematic diagram illustrating the operation of a distance measurement unit according to one or more embodiments.

FIG. 8 is a schematic diagram illustrating the operation of the distance measurement unit according to one or more embodiments.

Referring to FIGS. 5 and 8, as described above, the light irradiation unit 410 and the first sensor unit 420 of the distance measurement unit 400 may be spaced from each other in the third direction DR3. The light irradiation unit 410 may be disposed on the lower surface of the support 240 that faces the stage 100, and the first sensor unit 420 may be disposed on the upper surface of the stage 100 that faces the support 240. However, the present disclosure is not limited thereto. The light irradiation unit 410 may also be disposed on the upper surface of the stage 100 that faces the support 240, and the first sensor unit 420 may also be disposed on the lower surface of the support 240 that faces the stage 100.

The light irradiation unit 410 may emit inspection light LD to the first sensor unit 420 to measure the distance between the light emitting element structure 1000 and the second probe 220. In one or more embodiments, the inspection light LD may include ultraviolet rays, infrared rays, and laser beams.

The first sensor unit 420 may measure the distance between the second probe 220 and the light emitting element structure 1000 by sensing the inspection light LD emitted from the light irradiation unit 410. Specifically, the first sensor unit 420 may measure the distance between the light irradiation unit 410 and the first sensor unit 420 in the third direction DR3 through the inspection light LD emitted from the light irradiation unit 410. The distance between the light irradiation unit 410 and the first sensor unit 420 in the third direction DR3 may be used to calculate a distance d between the upper surfaces of the light emitting elements ED and the lower surface of the second probe 220. For example, a difference between the calculated distance between the light irradiation unit 410 and the first sensor unit 420 and a height (or distance) from a lower surface of the base substrate 1100 of the light emitting element structure 1000 to the upper surfaces of the light emitting elements ED may be the distance d between the upper surfaces of the light emitting elements ED and the lower surface of the second probe 220. The distance data between the second probe 220 and the light emitting element structure 1000 calculated by the first sensor unit 420 may be transmitted to the control unit 600. The control unit 600 may control the moving speed of the second probe drivers 250 and 260 based on the distance data received from the first sensor unit 420. In one or more embodiments, the first sensor unit 420 may include at least one of a camera, an infrared sensor, an ultraviolet sensor, and a laser sensor.

Figure 9:
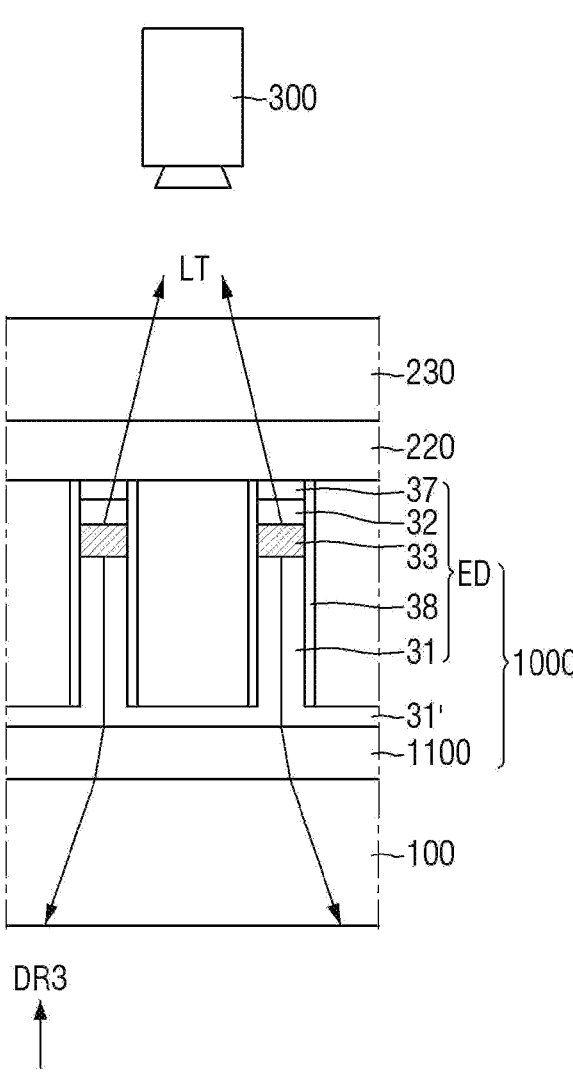
FIG. 9 is a schematic diagram illustrating the operation of an optical measurement unit according to one or more embodiments.

FIG. 9 is a schematic diagram illustrating the operation of the optical measurement unit according to one or more embodiments.

Referring to FIGS. 5, 6, and 9, when the first probe 210 contacts the first semiconductor connection layer 31' of the light emitting element structure 1000 to transmit the first voltage to the first semiconductor connection layer 31' and when the second probe 220 contacts the electrode layers 37 of the light emitting elements ED of the light emitting element structure 1000 to transmit the second voltage to an end of each of the light emitting elements ED, the light emitting elements ED in contact with the second probe 220 may emit light. Specifically, the first semiconductor connection layer 31' receiving the first voltage from the first probe 210 may transmit the first voltage to the first semiconductor layer 31 of each light emitting element ED. In addition, the electrode layer 37 of each light emitting element ED receiving the second voltage from the second probe 220 may transmit the second voltage to the second semiconductor layer 32. Accordingly, the light emitting layer 33 of each light emitting element ED may emit light by the first semiconductor layer 31 and the second semiconductor layer 32 of the light emitting element ED receiving the electric signals. The direction of light LT emitted from each light emitting element ED is not limited to one direction as described above. For example, the light LT emitted from each light emitting element ED may travel upward and downward from the light emitting layer 33.

The light LT travelling upward after being emitted from the light emitting elements ED may pass through the second probe 220 and the base frame 230 disposed on the light emitting elements ED and then proceed to the optical measurement unit 300. Because the second probe 220 and the base frame 230 include a transparent material as described above, the light LT travelling upward after being emitted from the light emitting elements ED can pass through the second probe 220 and the base frame 230. The optical measurement unit 300 may sense the light LT passing through the second probe 220 and the base frame 230 after being emitted from the light emitting elements ED and may measure characteristics of the light LT or inspect whether the light emitting elements ED emit light.

The optical measurement unit 300 may measure optical characteristics of the light emitting elements ED of the light emitting element structure 1000. For example, the optical measurement unit 300 may include a camera and a spectrometer to measure the optical characteristics of the light LT emitted from the light emitting elements ED. For example, the optical measurement unit 300 may include a camera, and the camera may be disposed above the light emitting element structure 1000 to photograph the light emitting elements ED disposed under the camera. In addition, the optical measurement unit 300 may analyze an image captured and generated by the camera using a spectrometer to identify whether each of the light emitting elements ED emits light and to measure an optical characteristic value (e.g., an average luminance value of the sensed light LT or an average wavelength value of the sensed light LT) of each of the light emitting elements ED. Based on the measured characteristic value of the light LT emitted from each of the light emitting elements ED, it is possible to identify whether the light emitting element ED is defective and also possible to calculate the position of a defective light emitting element ED on the base substrate 1100.

Figure 10:
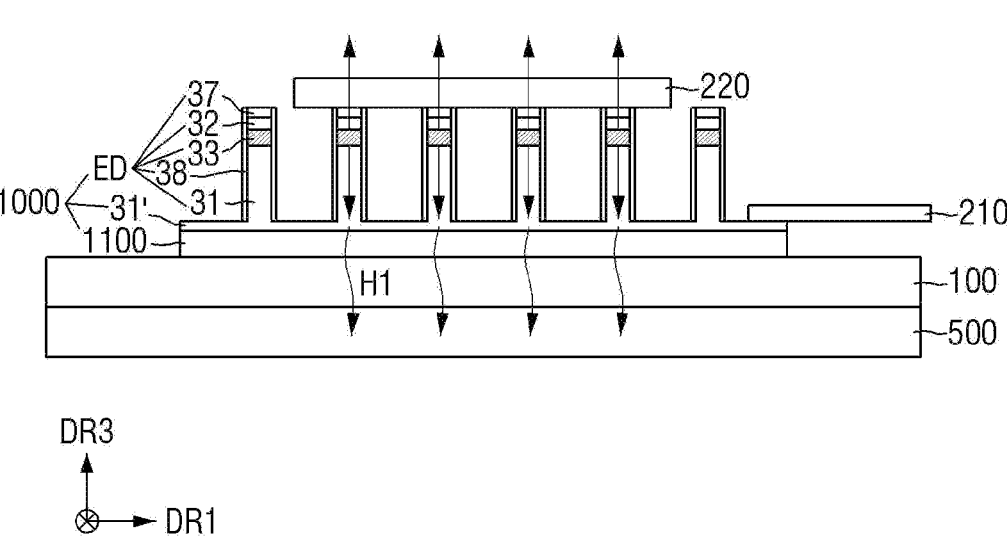
FIG. 10 is a schematic diagram illustrating the operation of a temperature control unit according to one or more embodiments.

FIG. 10 is a schematic diagram illustrating the operation of the temperature control unit according to one or more embodiments.

Referring to FIGS. 5 and 10, when the first probe 210 contacts the first semiconductor connection layer 31' of the light emitting element structure 1000 to apply the first voltage and when the second probe 220 contacts ends of the light emitting elements ED of the light emitting element structure 1000, specifically, the upper surfaces of the electrode layers 37 to apply the second voltage, the light emitting layers 33 of the light emitting elements ED may emit light. When the light emitting elements ED emit the light LT, heat H1 may be generated. As described above, the light emitting elements ED may be damaged by the heat H1. Therefore, the temperature control unit 500 disposed under the stage 100 may lower the temperature of the stage 100 by cooling the stage 100, thereby preventing the light emitting elements ED from being damaged by the heat H1 generated from the light emitting elements ED. However, the present disclosure is not limited thereto, and the temperature control unit 500 may further include a heat dissipation layer. When the temperature control unit 500 further includes the heat dissipation layer, the heat H1 generated from the light emitting elements ED may be dissipated through the heat dissipation layer to prevent an increase in the temperature of the light emitting elements ED.

An optical inspection method of the optical inspection device 1 of FIG. 5 described above will now be described. Elements substantially the same as those of FIG. 5 are indicated by the same reference numerals, and a detailed description thereof will be omitted or given briefly.

FIGS. 11 through 15 are structural diagrams for explaining each process step in an optical inspection method of the optical inspection device according to one or more embodiments.

Figure 11:
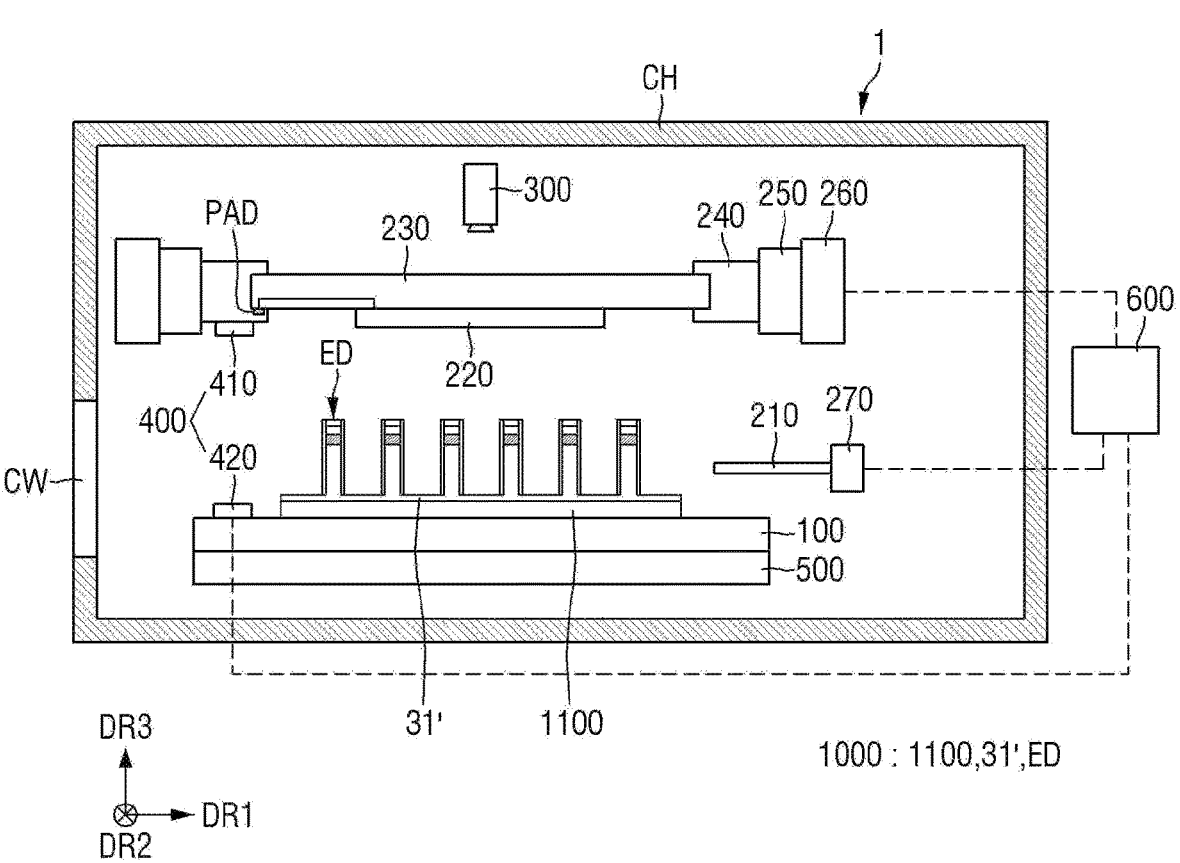
FIGS. 11 through 15 are structural diagrams for explaining each process step in an optical inspection method of the optical inspection device according to one or more embodiments.

First, referring to FIG. 11, a light emitting element structure 1000 is prepared on a stage 100. As described above, the light emitting element structure 1000 may include a base substrate 1100, a first semiconductor connection layer 31' formed on a surface of the base substrate 1100, and a plurality of light emitting elements ED integrated with the first semiconductor connection layer 31' and each including a first semiconductor layer 31 protruding upward. The light emitting element structure 1000 may be placed on the stage 100 such that the base substrate 1100 is located under the first semiconductor connection layer 31' and that the light emitting elements ED are located on the first semiconductor connection layer 31'. Therefore, in each of the light emitting elements ED of the light emitting element structure 1000 placed on the stage 100, the first semiconductor layer 31 may be located under a light emitting layer 33, and a second semiconductor layer 32 may be located on the light emitting layer 33.

Figure 12:
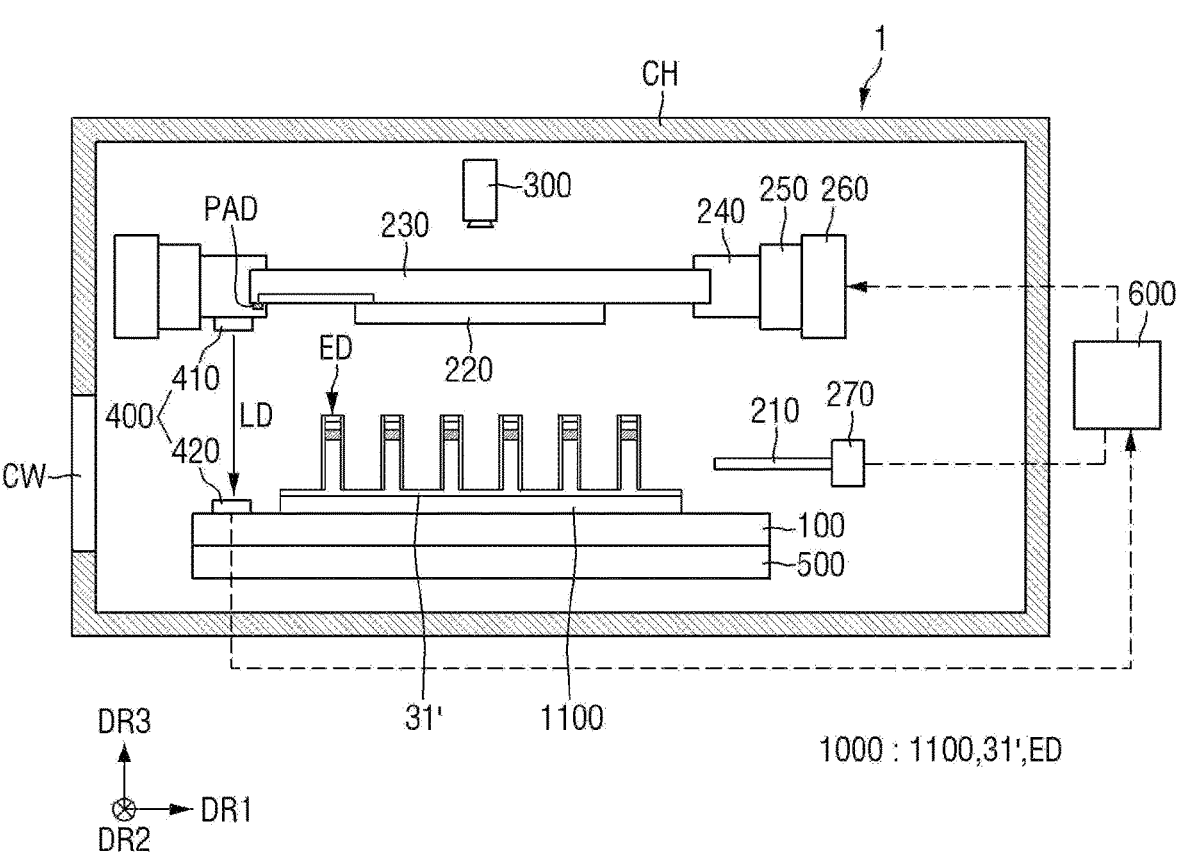

Next, referring to FIG. 12, when the light emitting element structure 1000 is prepared on the stage 100, a second probe 220 may be moved by second probe drivers 250 and 260. The second probe drivers 250 and 260 may be controlled by a control unit 600 based on a distance between the second probe 220 and the light emitting element structure 1000 measured using a distance measurement unit 400. Specifically, a light irradiation unit 410 of the distance measurement unit 400 may irradiate inspection light LD, and a first sensor unit 420 may measure a distance between the light emitting elements ED and the second probe 220 by sensing the inspection light LD. The first sensor unit 420 may transmit the measured distance data to the control unit 600, and the control unit 600 may control the moving speed of the second probe drivers 250 and 260 based on the received distance data. The second probe drivers 250 and 260 may move the second probe 220 to bring the second probe 220 into contact with upper surfaces of the light emitting elements ED, for example, upper surfaces of electrode layers 37.

In the bringing of the second probe 220 into contact with the upper surfaces of the light emitting elements ED, for example, the upper surfaces of the electrode layers 37, the control unit 600 may precisely control the second probe drivers 250 and 260 based on the distance data measured by the distance measurement unit 400 to reduce or minimize damage to the light emitting elements ED by a force generated by the contact between the light emitting elements ED and the second probe 220. In addition, because the base frame 230 includes a transparent elastomer as described above, a force that may be generated when the second probe 220 contacts ends of the light emitting elements ED may be dispersed. Accordingly, damage to the light emitting elements ED can be reduced or minimized.

Figure 13:
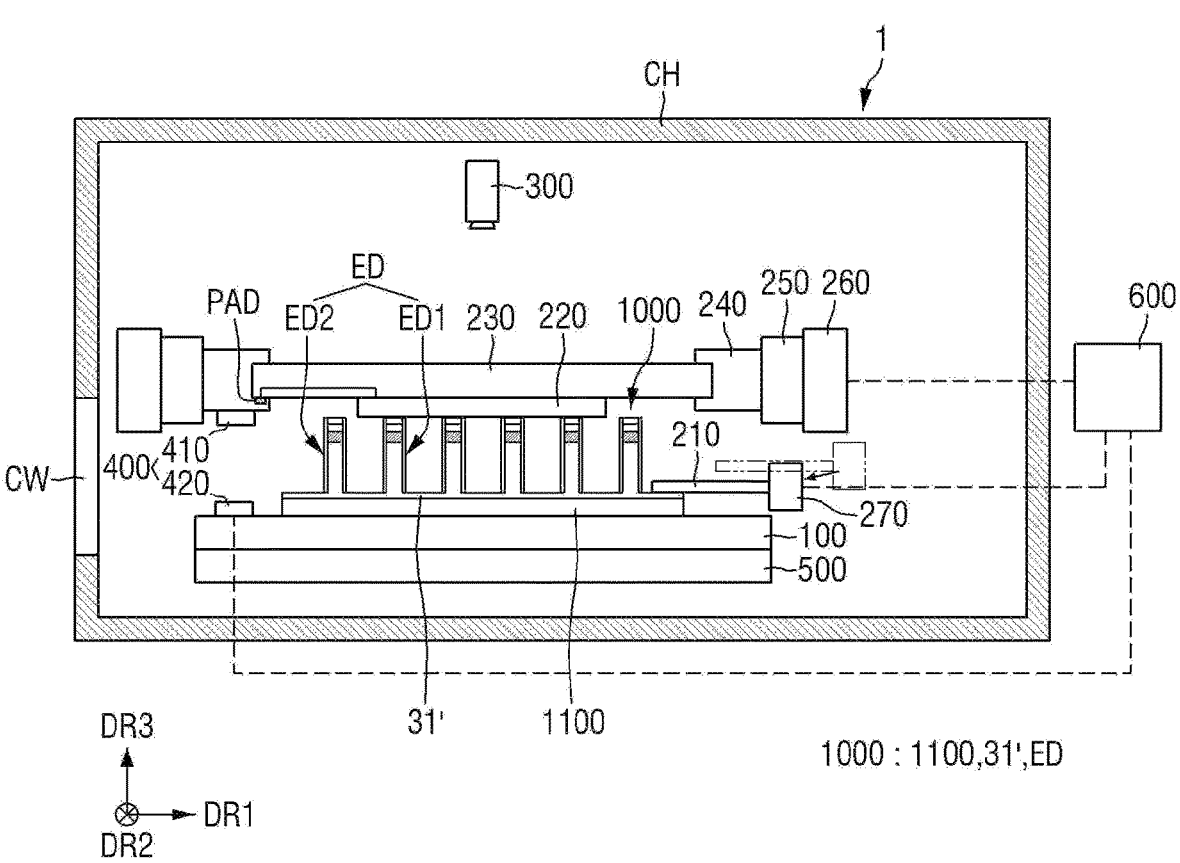

Next, referring to FIG. 13, when the second probe 220 contacts end surfaces of at least some of the light emitting elements ED included in the light emitting element structure 1000, a first probe 210 may be moved by a first probe driver 270 to contact the first semiconductor connection layer 31' of the light emitting element structure 1000. The control unit 600 may control the first probe driver 270 to bring the first probe 210 into contact with the first semiconductor connection layer 31' of the light emitting element structure 1000.

Figure 14:
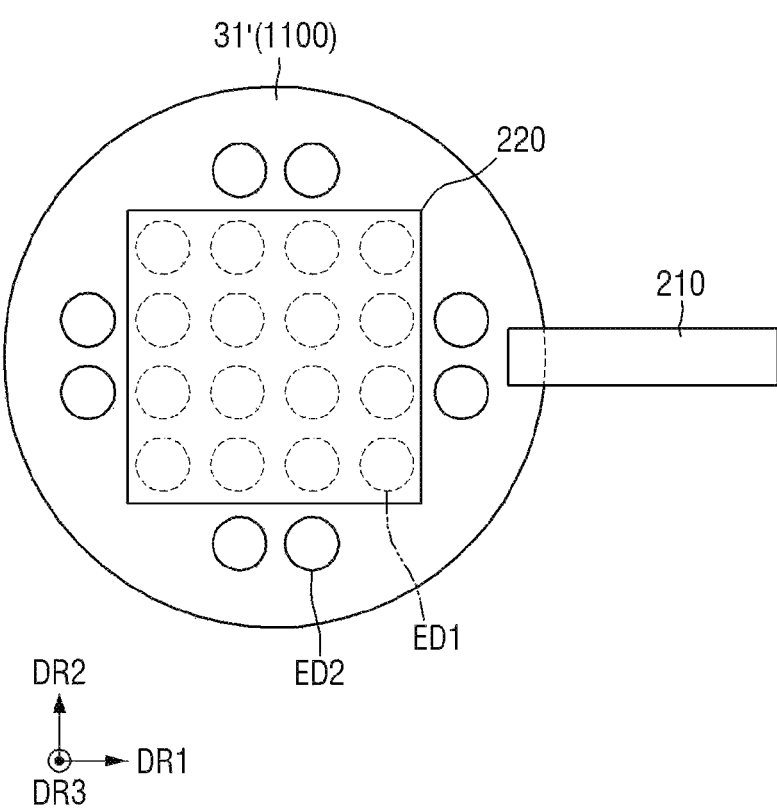

As illustrated in FIG. 14, the first probe 210 moved by first probe driver 270 may overlap and contact the first semiconductor connection layer 31' of the light emitting element structure 1000 in the third direction DR3, and the second probe 220 moved by the second probe drivers 250 and 260 may overlap and contact at least some of the light emitting elements ED of the light emitting element structure 1000 in the third direction DR3. The light emitting elements ED formed on the base substrate 1100 may include first light emitting elements ED1 overlapping the second probe 220 in the third direction DR3 and second light emitting elements ED2 not overlapping the second probe 220 in the third direction DR3.

Figure 15:
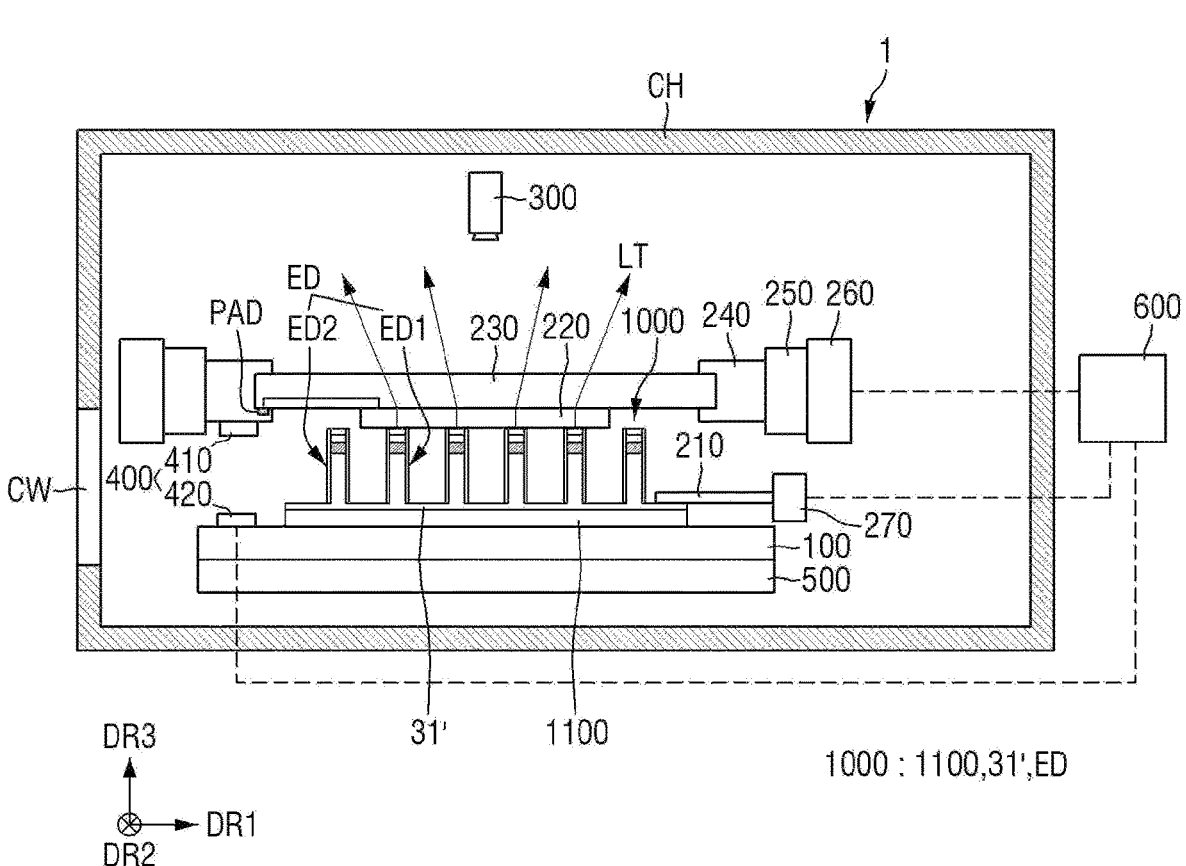

Next, referring to FIG. 15, a first voltage and a second voltage may be applied to the first semiconductor connection layer 31' of the light emitting element structure 1000 and the electrode layers 37 of the light emitting elements ED through the first probe 210 and the second probe 220, respectively. In this case, the first voltage may be applied to each of the first semiconductor layers 31 of the light emitting elements ED through the first semiconductor connection layer 31' in contact with the first probe 210. In addition, the second voltage may be applied to each of the second semiconductor layers 32 of the first light emitting elements ED through the electrode layers 37 of the first light emitting elements ED1 in contact with the second probe 220. Accordingly, the first light emitting elements ED may emit light LT. An optical measurement unit 300 may measure an optical characteristic value of the light LT emitted from each of the first light emitting elements ED. In this case, the second light emitting elements ED not in contact with the second probe 220 may not emit light.

Another embodiment of the second probe will now be described.

Figure 16:
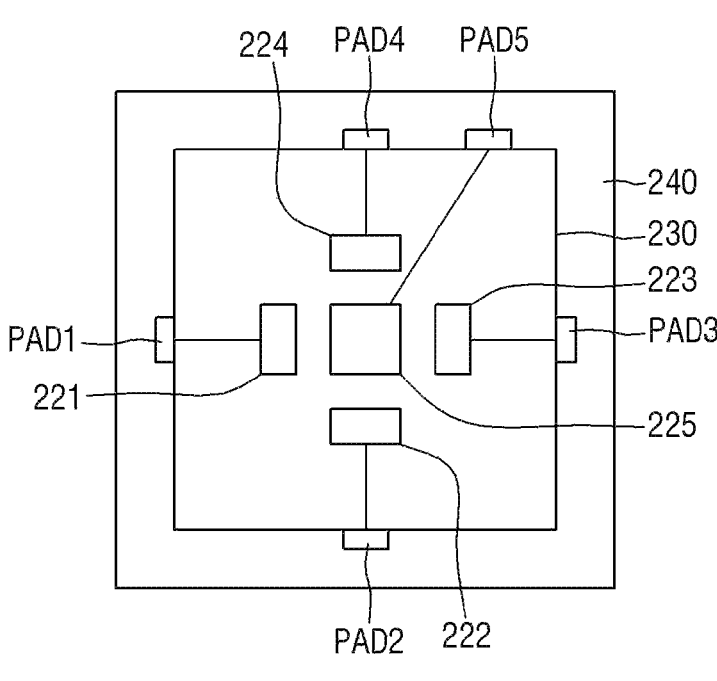
FIG. 16 is a bottom view illustrating the relative arrangement of a support, a base frame, and a second probe according to one or more embodiments.
Figure 16:
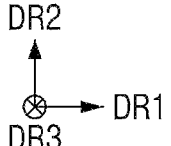

FIG. 16 is a bottom view illustrating the relative arrangement of a support, a base frame, and a second probe according to one or more embodiments.

Referring to FIG. 16, the second probe 220_1 according to the current embodiment is different from that of the embodiment of FIG. 7 in that it includes a plurality of sub-probes.

Specifically, the second probe 220_1 may include first through fifth sub-probes 221 through 225. The first through fifth sub-probes 221 through 225 may be disposed on a lower surface of the base frame 230 and spaced from each other. In the drawing, the first through fourth sub-probes 221 through 224 have the same planar shape, and the fifth sub-probe 225 has a different planar shape from the first through fourth sub-probes 221 through 224. However, the present disclosure is not limited thereto. The planar shapes of the first through fifth sub-probes 221 through 225 may also be the same or different from each other. The planar area of each of the sub-probes 221 through 225 may be large enough to cover at least one light emitting element ED.

A probe pad PAD_1 may include first through fifth probe pads PAD1 through PAD5. The first through fifth probe pads PAD1 through PAD5 may be spaced from each other. The first through fifth probe pads PAD1 through PAD5 may be respectively connected to the first through fifth sub-probes 221 through 225 to transmit electrical signals to the first through fifth sub-probes 221 through 225. The electrical signals may be concurrently (e.g., simultaneously) transmitted or may be sequentially transmitted according to an area to be inspected. In this case, because the electric signals are sequentially transmitted to each area, the accuracy of optical characteristics of the light emitting elements ED at each position can be improved.

Figure 17:
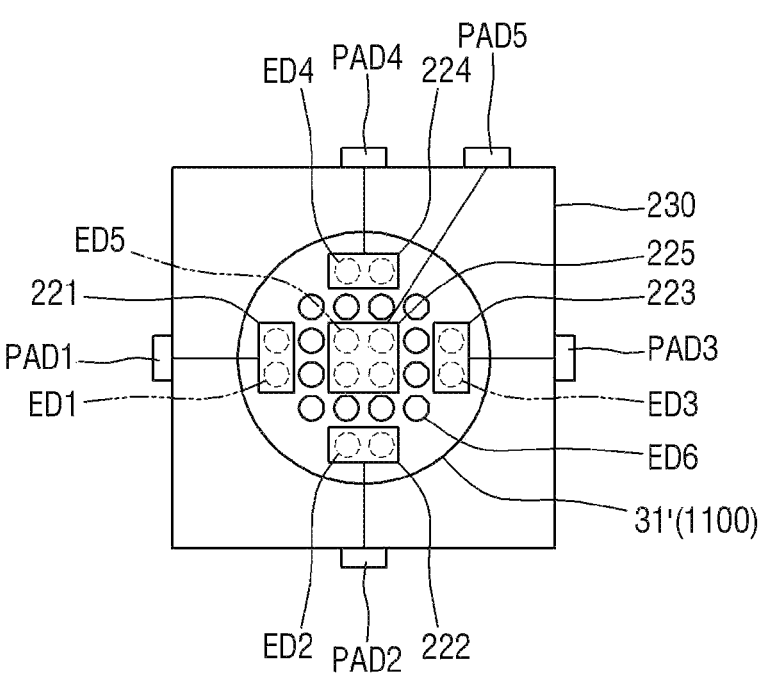
FIG. 17 is a bottom view illustrating the relative arrangement of the support, the base frame and the second probe of FIG. 16 and a light emitting element structure.
Figure 17:
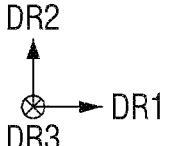
Figure 18:
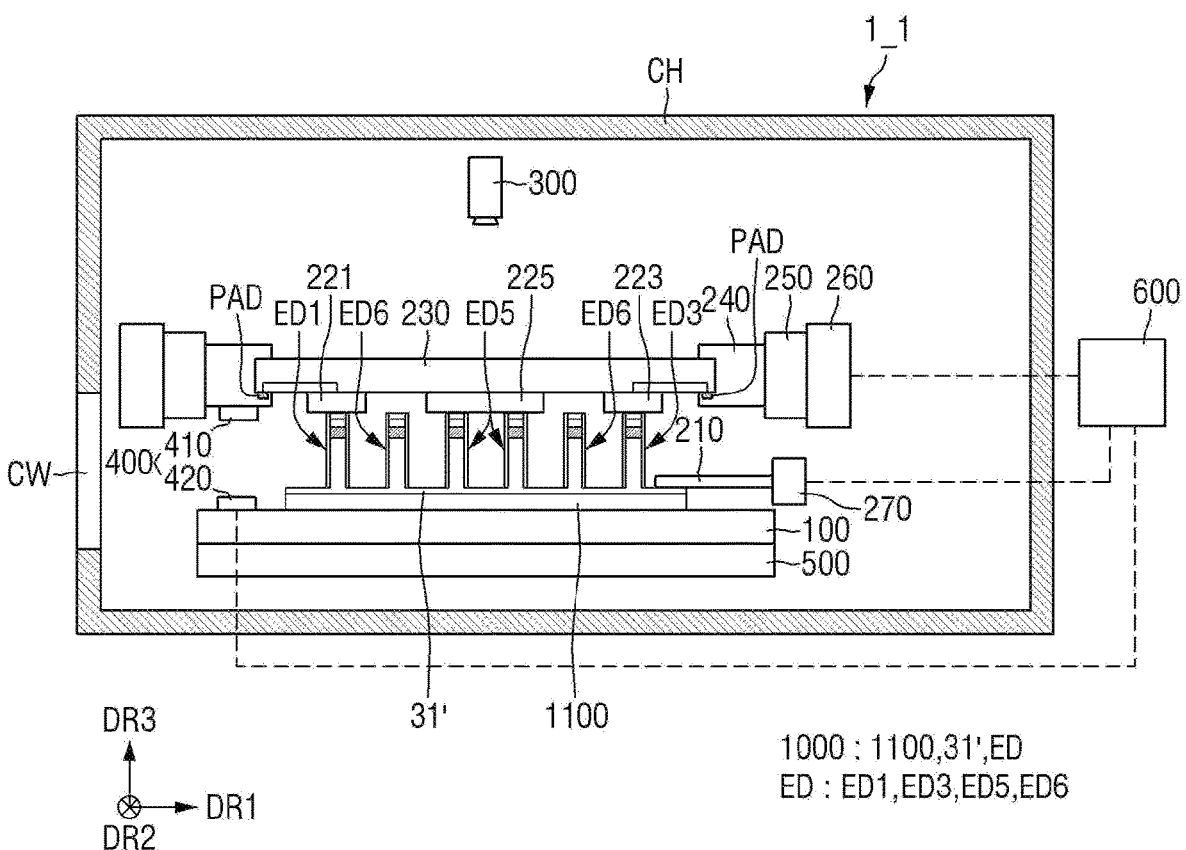
FIG. 18 is a structural diagram of an optical inspection device including the second probe of FIG. 16.

FIG. 17 is a bottom view illustrating the relative arrangement of the support, the base frame and the second probe of FIG. 16 and a light emitting element structure. FIG. 18 is a structural diagram of an optical inspection device including the second probe of FIG. 16.

Referring to FIGS. 17 and 18, a plurality of light emitting elements ED included in the light emitting element structure 1000 may include first through fifth light emitting elements ED1 through ED5 respectively overlapping and contacting the first through fifth sub-probes 221 through 225 in the third direction DR3 and sixth light emitting elements ED not overlapping the first through fifth sub-probes 221 through 225 in the third direction DR3.

The optical inspection device 1_1 (e.g., see FIG. 18) according to the current embodiment may measure optical characteristics of the first through fifth light emitting elements ED disposed in different areas through the first through fifth sub-probes 221 through 225 spaced from each other. For example, when the first through fifth sub-probes 221 through 225 sequentially transmit electrical signals, the first through fifth light emitting elements ED may sequentially emit light. Therefore, the optical characteristics of the light emitting elements ED formed on a base substrate 1100 can be measured for each area, thus improving inspection accuracy.

Figure 19:
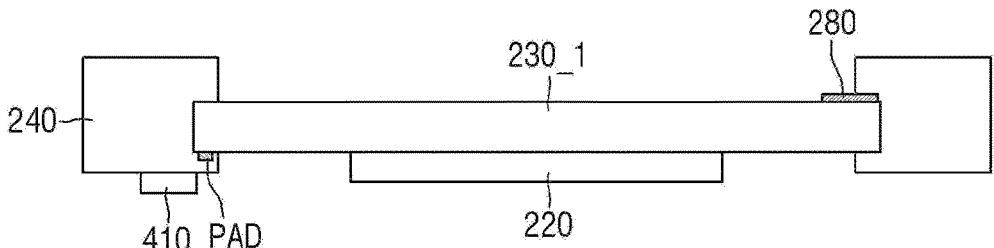
FIG. 19 is a partial cross-sectional view of an optical inspection device according to one or more embodiments.
Figure 20:
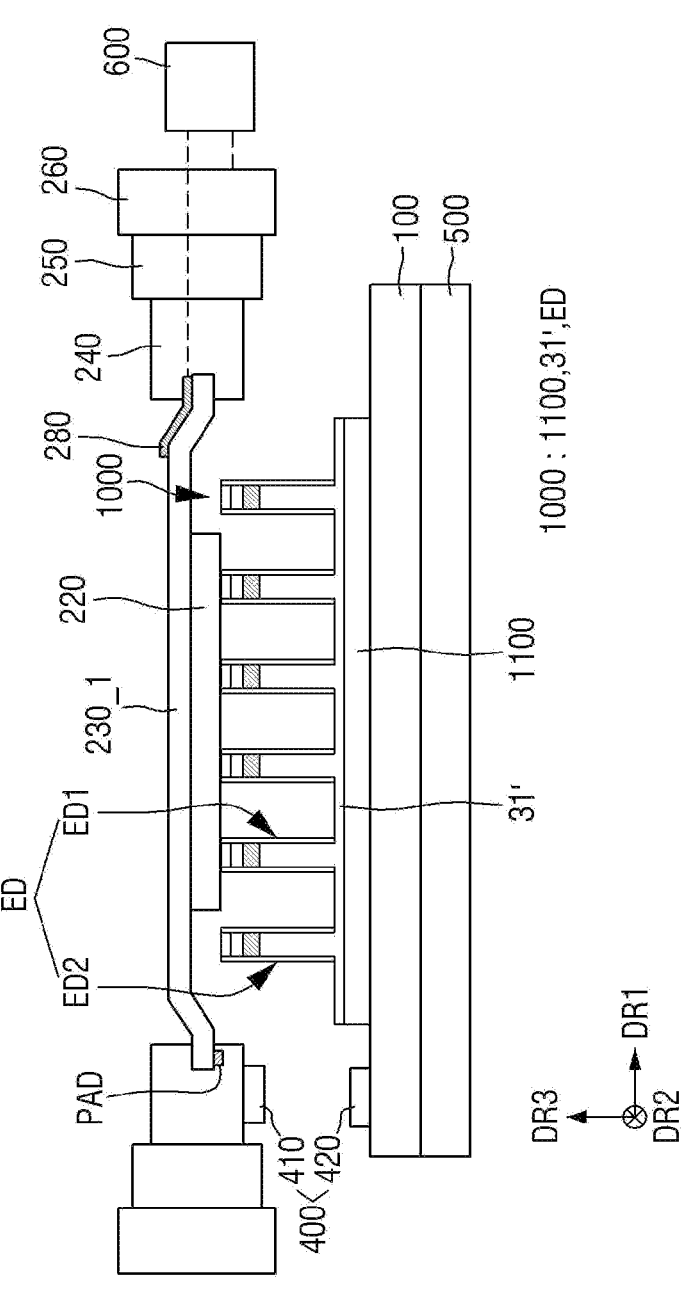
FIG. 20 is a structural diagram illustrating the operation of the optical inspection device of FIG. 19 according to one or more embodiments.

FIG. 19 is a partial cross-sectional view of an optical inspection device according to one or more embodiments. FIG. 20 is a structural diagram illustrating the operation of the optical inspection device of FIG. 19.

Referring to FIGS. 19 and 20, the optical inspection device according to the current embodiment is different from that of the embodiment of FIG. 5 in that a second sensor unit 280 is further disposed on a surface of a base frame 230_1.

In the current embodiment, the base frame 230_1 may include a transparent elastomer. Because the base frame 230_1 includes the transparent elastomer, it may be deformed by a force or stimulus applied from the outside. When a second probe 220 contacts ends of light emitting elements ED as illustrated in FIG. 20, forces acting in opposite directions may be generated between the second probe 220 and the light emitting elements ED. Here, the base frame 230_1 including the transparent elastomer may be deformed according to the forces acting on each other when the second probe 220 contacts the ends of the light emitting elements ED.

The second sensor unit 280 may include a sensor for sensing whether the base frame 230_1 is deformed and the degree of deformation. In one or more embodiments, the second sensor unit 280 may include a pressure sensor. For example, the pressure sensor may be a resonant pressure sensor, a piezoelectric pressure sensor, a strain gauge pressure sensor, or a capacitive pressure sensor. In one or more embodiments, the second sensor unit 280 may include a strain gauge pressure sensor. When the second sensor unit 280 includes a pressure sensor including a strain gauge, it may sense whether the base frame 230_1 is deformed and the degree of deformation based on a change in the resistance value of the strain gauge. The second sensor unit 280 may sense whether the base frame 230_1 is deformed and the degree of deformation and transmit the sensing result to a control unit 600. When the deformation of the base frame 230_1 is sensed by the second sensor unit 280, the control unit 600 may determine that the light emitting elements ED and the second probe 220 are in contact with each other and may control second probe drivers 250 and 260 not to move. Therefore, it is possible to prevent an external force from acting on the light emitting elements ED and thus damaging the light emitting elements ED.

Figure 21:
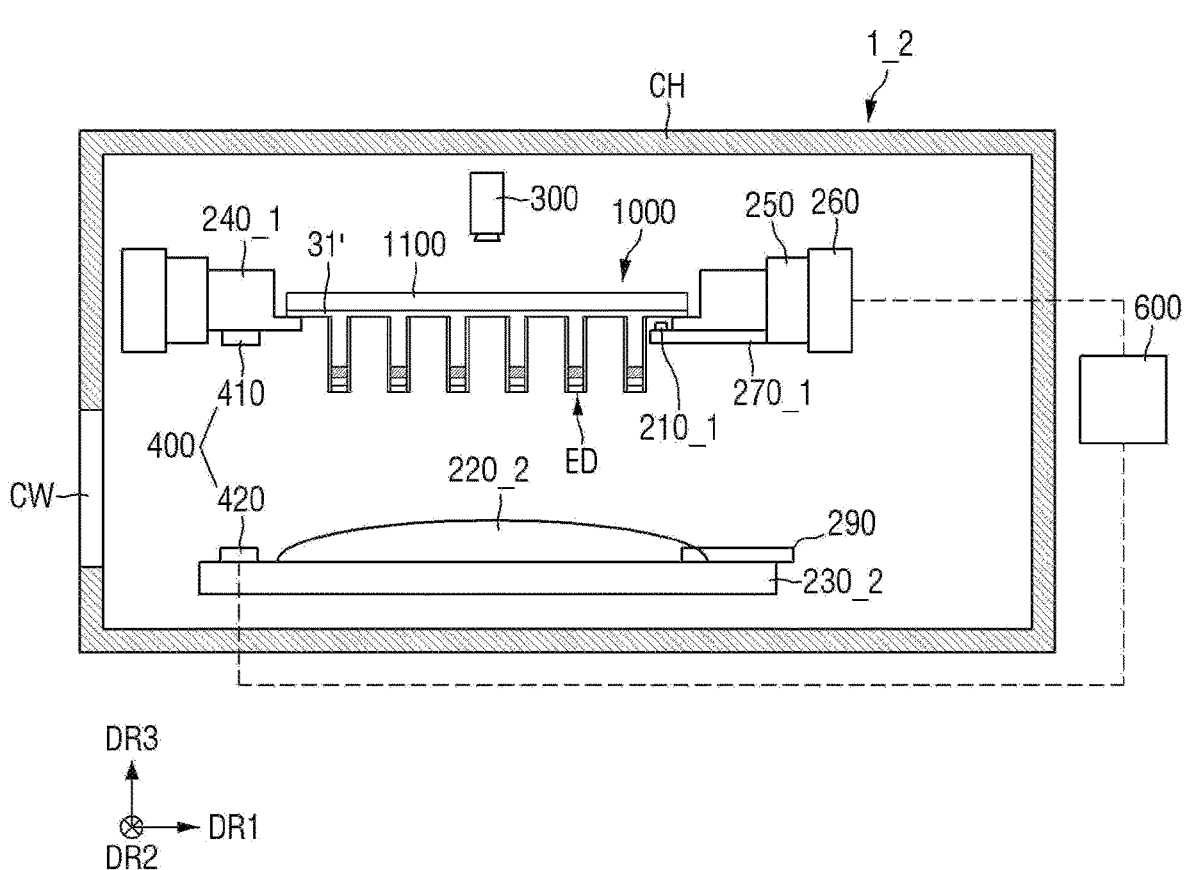
FIG. 21 is a structural diagram of an optical inspection device according to one or more embodiments.

FIG. 21 is a structural diagram of an optical inspection device according to one or more embodiments.

Referring to FIG. 21, the optical inspection device 1_2 according to the current embodiment is different from that of the embodiment of FIG. 5 in that a second probe 220_2 is disposed in a lower portion of a chamber CH, and a first probe 210_1 is disposed in an upper portion of the chamber CH.

In the current embodiment, a light emitting element structure 1000 may be prepared on a support 240_1 such that a plurality of light emitting elements ED face downward from a base substrate 1100. The support 240_1 may include a structure partially protruding inward, and the light emitting element structure 1000 may be placed on the protruding structure. A first probe driver 270_1 may be disposed on a lower surface of the support 240_1. The first probe 210_1 may be disposed on an upper surface of the first probe driver 270_1.

A base frame 230_2 may be disposed in the lower portion of the chamber CH. The second probe 220_2 may be disposed on an upper surface of the base frame 230_2. In the current embodiment, the second probe 220_2 may include a conductive fluid, for example, a liquid metal or a conductive elastomer. The conductive elastomer may include nano-scale metal nanoparticles (NP) made of a conductive metal material, metal nanowires (NW) whose conductivity is increased by a reduction in the gap between conductive materials when external pressure is applied, or an elastomer composite.

Because the second probe 220_2 includes a liquid metal or a conductive elastomer, it is possible to reduce or minimize damage to the light emitting elements ED by a force that may be generated when the light emitting elements ED and the second probe 220_2 contact each other.

A probe pad 290 may be disposed on a side of the second probe 220_2. The probe pad 290 may contact and may be electrically connected to the second probe 220_2. The probe pad 290 may transmit an electrical signal received from a voltage applying device to the second probe 220_2.

An optical inspection method of the optical inspection device 1_2 of FIG. 21 will now be described. Elements substantially the same as those of FIG. 21 are indicated by the same reference numerals, and a detailed description thereof will be omitted or given briefly.

Figure 22:
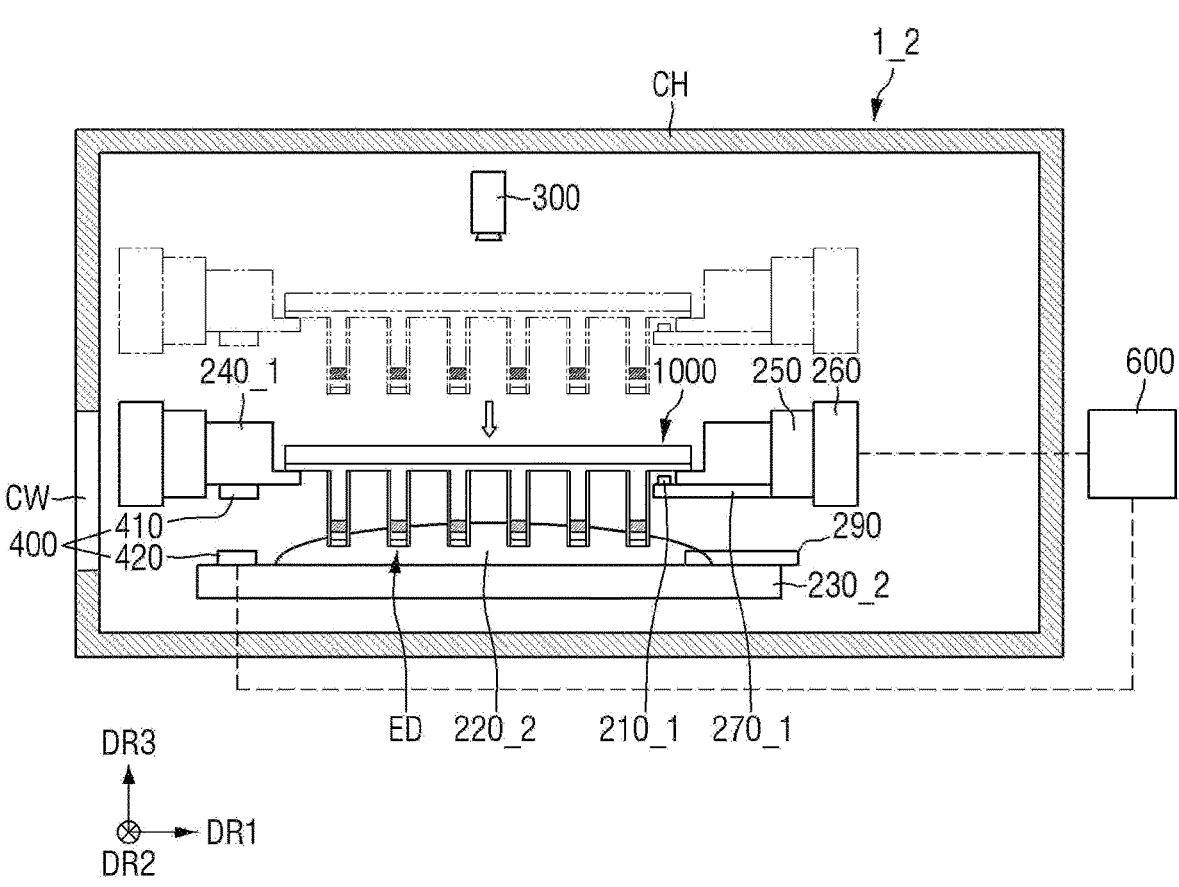
FIGS. 22 through 24 are structural diagrams for explaining each process step in an optical inspection method of the optical inspection device of FIG. 21 according to one or more embodiments.
Figure 23:
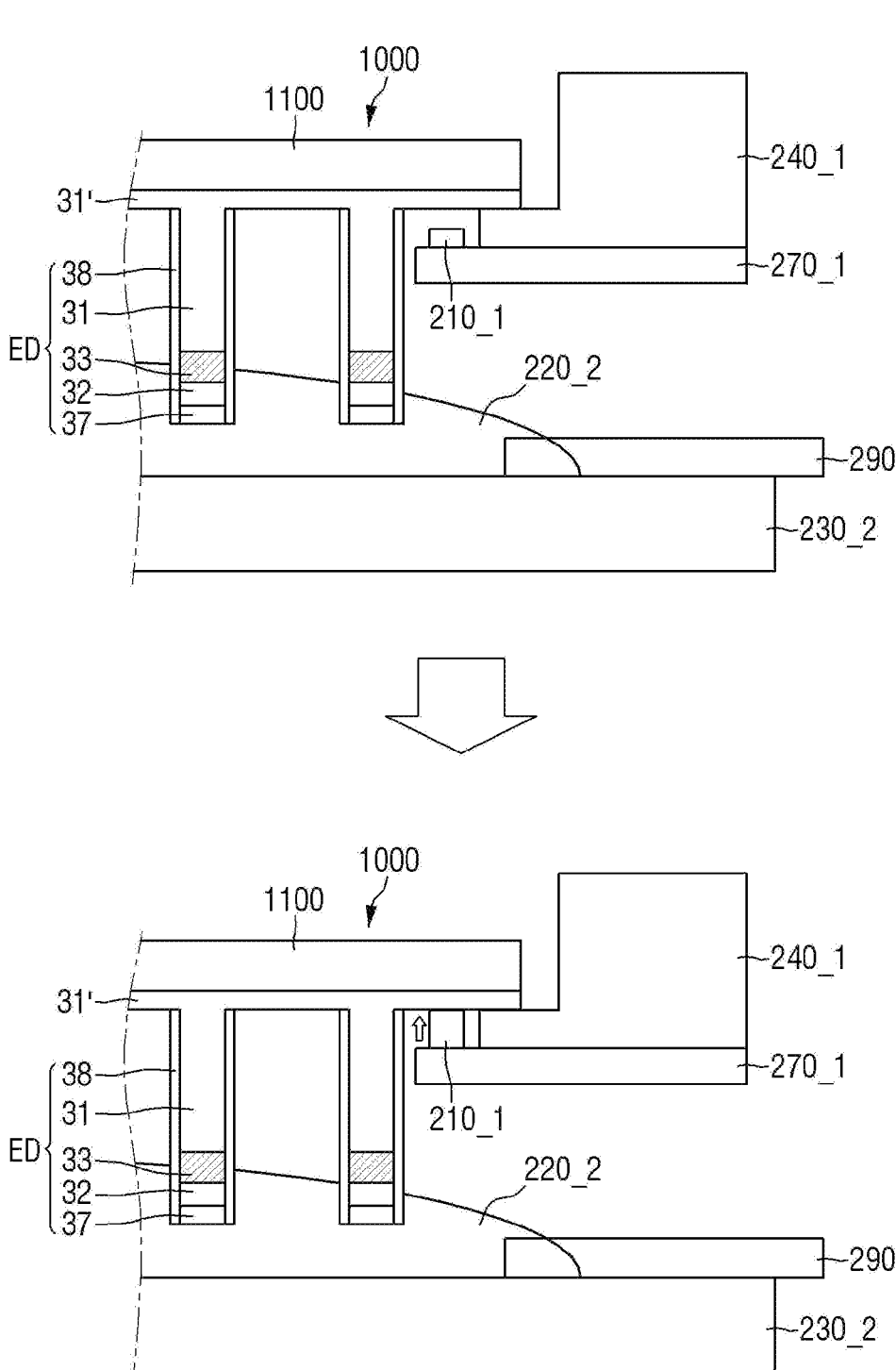
Figure 24:
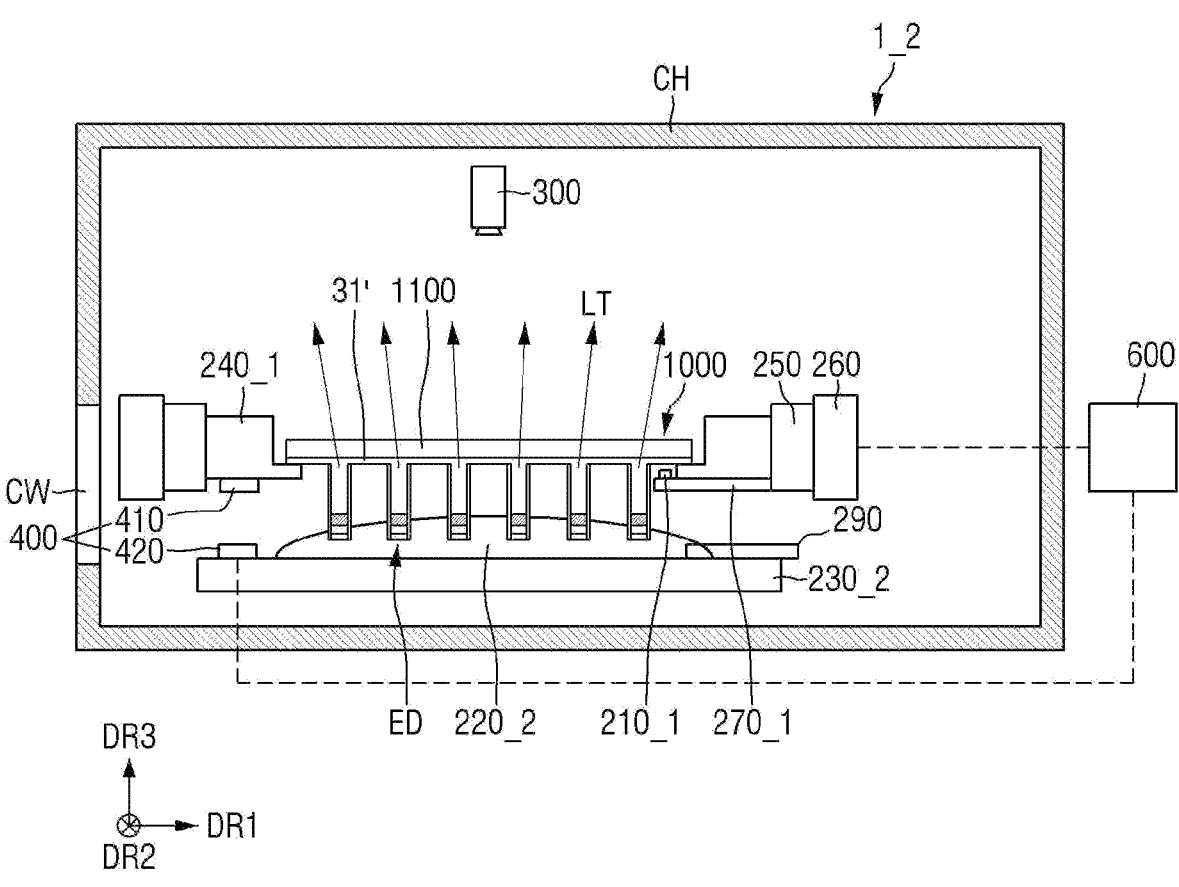

FIGS. 22 through 24 are structural diagrams for explaining each process step in an optical inspection method of the optical inspection device of FIG. 21.

First, referring to FIG. 21, a light emitting element structure 1000 is prepared on a support 240_1. As described above, the light emitting element structure 1000 may be fixed on the support 240_1 such that a base substrate 1100 faces upward, and light emitting elements ED face downward.

Next, referring to FIG. 22, the support 240_1 may be moved by the second probe drivers 250 and 260 to bring an end of each of the light emitting elements ED and a second probe 220_2 into contact with each other. In this operation, the support 240_1 may be moved in a horizontal direction or a vertical direction by the second probe drivers 250 and 260, and the light emitting element structure 1000 fixed to the support 240_1 may be moved. The end of each of the light emitting elements ED may contact the second probe 220_2 located under the light emitting elements ED.

Next, referring to FIG. 23, when the end of each of the light emitting elements ED contacts the second probe 220_2, a first probe 210_1 is moved by a first probe driver 270_1 disposed under the support 240_1 to bring the first probe 210_1 and a first semiconductor connection layer 31' of the light emitting element structure 1000 into contact with each other.

Next, referring to FIG. 24, when the second probe 220_2 contacts the end of each of the light emitting elements ED and when the first probe 210_1 contacts the first semiconductor connection layer 31', electrical signals may be transmitted from a voltage applying device to the first probe 210_1 and the second probe 220_2. The second probe 220_2 may receive an electrical signal through a probe pad 290. In this case, the light emitting elements ED included in the light emitting element structure 1000 may emit light LT. As described above, the direction of the light LT emitted from each of the light emitting elements ED is not limited to one direction. Therefore, an optical measurement unit 300 may measure optical characteristics of the light LT travelling upward in the chamber CH after passing through the base substrate 1100 from among the light LT emitted from each of the light emitting elements ED.

Figure 25:
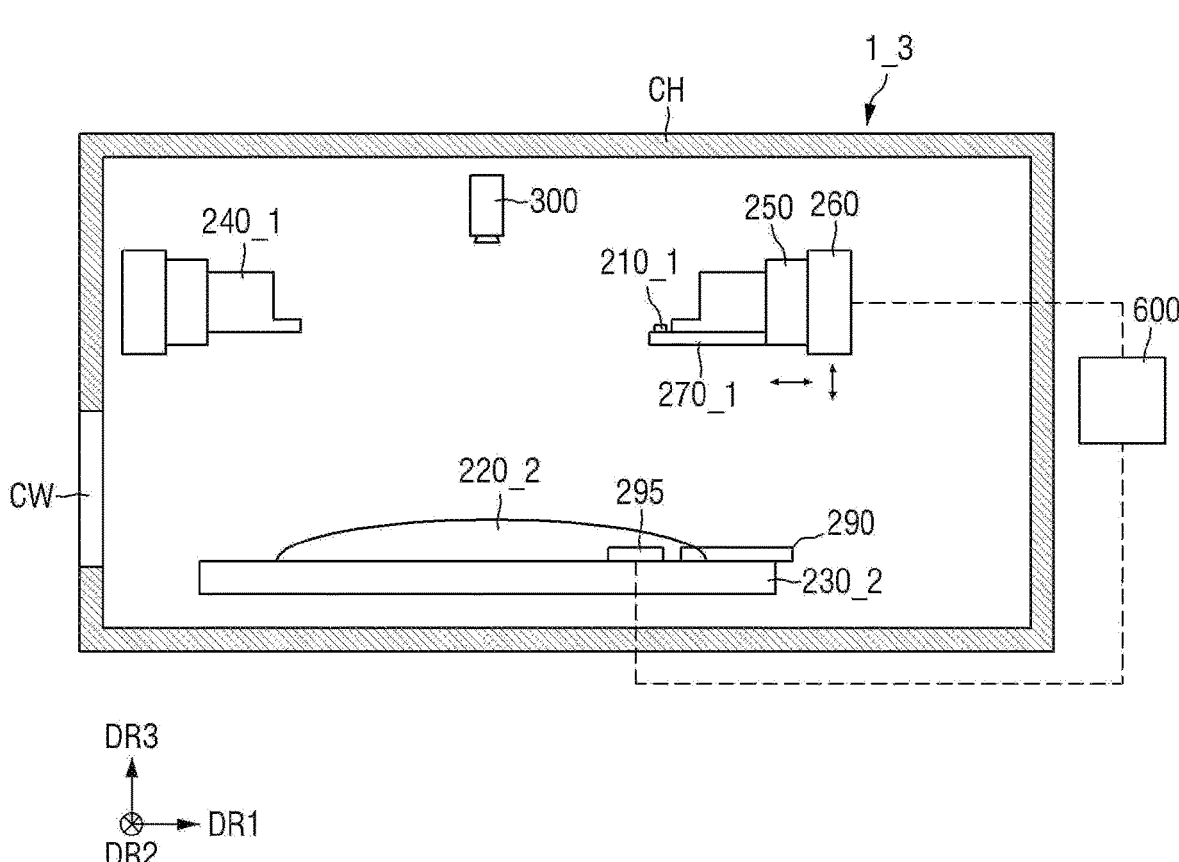
FIG. 25 is a structural diagram of an optical inspection device according to one or more embodiments.
Figure 26:
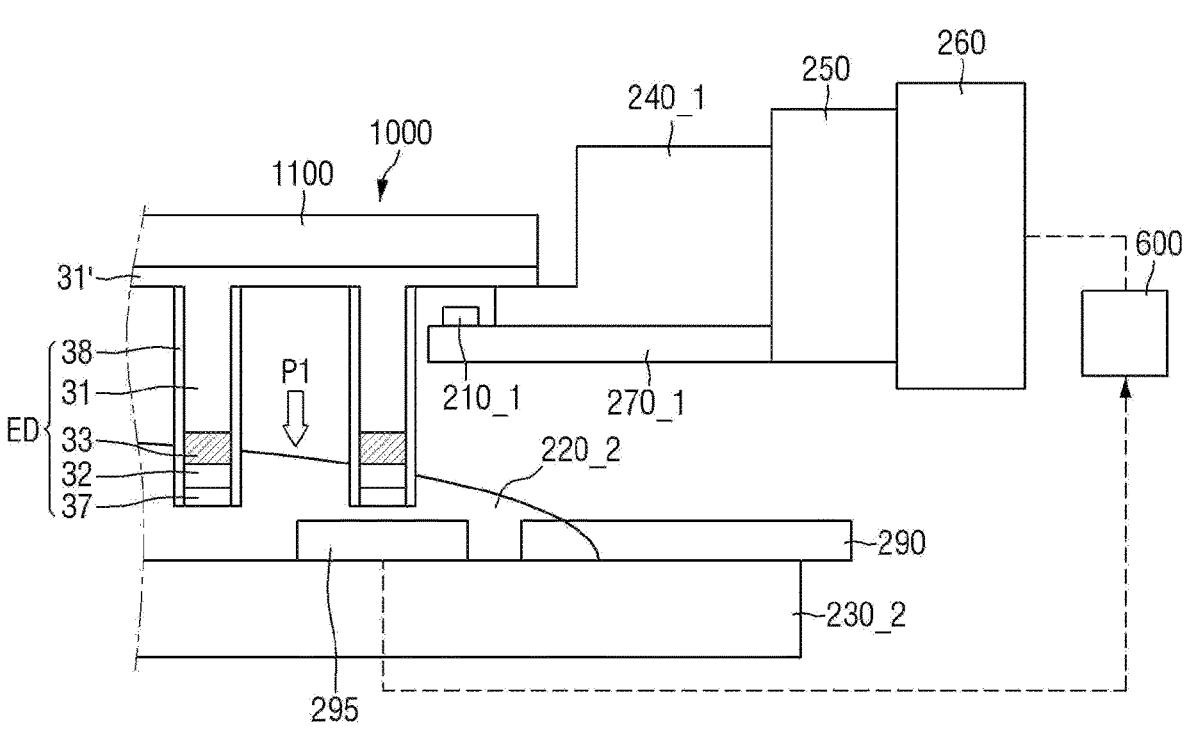
FIG. 26 is a schematic diagram illustrating the operation of a third sensor unit of the optical inspection device of FIG. 25 according to one or more embodiments.

FIG. 25 is a structural diagram of an optical inspection device according to one or more embodiments. FIG. 26 is a schematic diagram illustrating the operation of a third sensor unit of the optical inspection device of FIG. 25 according to one or more embodiments.

Referring to FIGS. 25 and 26, the optical inspection device 1_3 according to the current embodiment is different from the optical inspection device 1_2 of FIG. 21 in that it further includes the third sensor unit 295 in a second probe 220_2.

Specifically, the third sensor unit 295 may be further disposed in the second probe 220_2 including a conductive elastomer. A light emitting element structure 1000 may be moved by probe drivers 250 and 260 to bring an end of each of a plurality of light emitting elements ED, for example, each electrode layer 37 into contact with the second probe 220_2. When the second probe 220_2 includes an elastomer, it may be deformed by external pressure P1 that is applied when the second probe 220_2 contacts the light emitting elements ED. The third sensor unit 295 may sense the degree of deformation of the second probe 220_2 by the external pressure P1 and sense whether the second probe 220_2 and the light emitting element structure 1000 are in contact with each other according to the degree of deformation. The information sensed by the third sensor unit 295 may be transmitted to a control unit 600, and the control unit 600 may control the drivers 250 and 260 based on the information to adjust the position of the light emitting element structure 1000.

In the current embodiment, the second probe 220_2 includes an elastomer that is deformed by an external stimulus, and the third sensor unit 295 is further included to sense whether the light emitting element structure 1000 is in contact with the second probe 220_2 according to the degree of deformation. Therefore, it is possible to bring the second probe 220_2 and the light emitting element structure 1000 into contact with each other even without a distance measurement unit.

Figure 27:
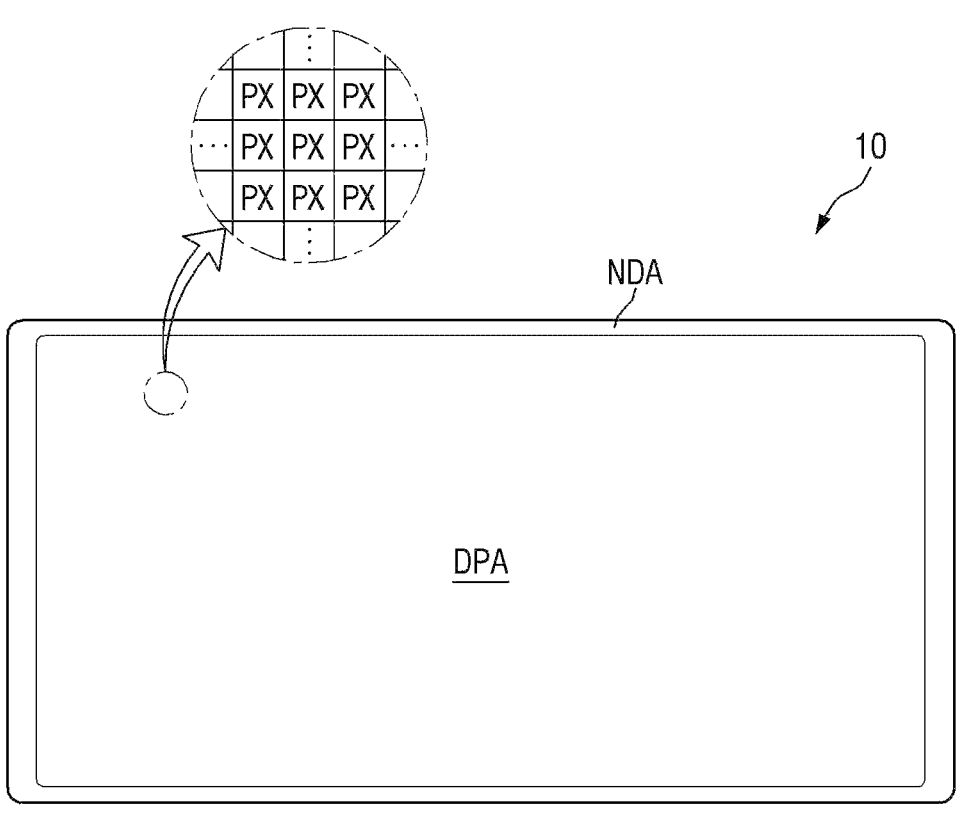
FIG. 27 is a schematic plan view of a display device according to one or more embodiments.
Figure 27:
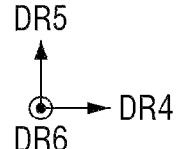

FIG. 27 is a schematic plan view of a display device according to an embodiment.

Referring to FIG. 27, the display device 10 displays moving images or still images. The display device 10 may refer to any electronic device that provides a display screen. Examples of the display device 10 may include a television, a notebook computer, a monitor, a billboard, an Internet of things (IOT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game console, a digital camera and a camcorder, all of which provide a display screen.

The display device 10 includes a display panel that provides a display screen. Examples of the display panel may include an inorganic light emitting diode display panel, an organic light emitting display panel, a quantum dot light emitting display panel, a plasma display panel, and a field emission display panel. A case where an inorganic light emitting diode display panel is applied as an example of the display panel will be described below, but the present disclosure is not limited to this case, and other display panels can also be applied as long as the same technical spirit is applicable.

In the drawings for describing the display device 10, a fourth direction DR4, a fifth direction DR5, and a sixth direction DR6 are defined. The fourth direction DR4 and the fifth direction DR5 may be perpendicular to each other in one plane. The sixth direction DR6 may be perpendicular to the plane in which the fourth direction DR4 and the fifth direction DR5 are located. The sixth direction DR6 is perpendicular to each of the fourth direction DR4 and the fifth direction DR5. In the embodiment for describing the display device 10, the sixth direction DR6 indicates a thickness direction of the display device 10.

The display device 10 may have a rectangular shape including long sides and short sides and longer in the fourth direction DR4 than in the fifth direction DR5 in a plan view. Corners at which the long and short sides of the display device 10 meet may be right-angled in a plan view. However, the present disclosure is not limited thereto, and the corners may also be rounded. The shape of the display device 10 is not limited to the above example and may also be variously changed. For example, the display device 10 may also have other planar shapes such as a square, a quadrilateral with rounded corners (vertices), other polygons, and a circle.

The display device 10 may include a display area DPA and a non-display area NDA along an edge or periphery of the display area DPA. The display area DPA may be an area where an image can be displayed, and the non-display area NDA may be an area where no image is displayed. The display area DPA may be an area into which the light emitting elements ED described above are sprayed during a process of manufacturing the display device 10.

The shape of the display area DPA may follow the shape of the display device 10. For example, the display area DPA may have a rectangular planar shape similar to the overall shape of the display device 10. The display area DPA may generally occupy the center (or the central portion) of the display device 10.

The display area DPA may include a plurality of pixels PX. The pixels PX may be arranged in a matrix direction. For example, the plurality of pixels PX may be arranged along rows and columns of a matrix. Each of the pixels PX may be rectangular or square in a plan view. Each of the pixels PX may include the above-described light emitting elements ED made of inorganic particles.

The non-display area NDA may be disposed around the display area DPA. The non-display area NDA may entirely or partially surround the display area DPA. The non-display area NDA may form a bezel of the display device 10.

Figure 28:
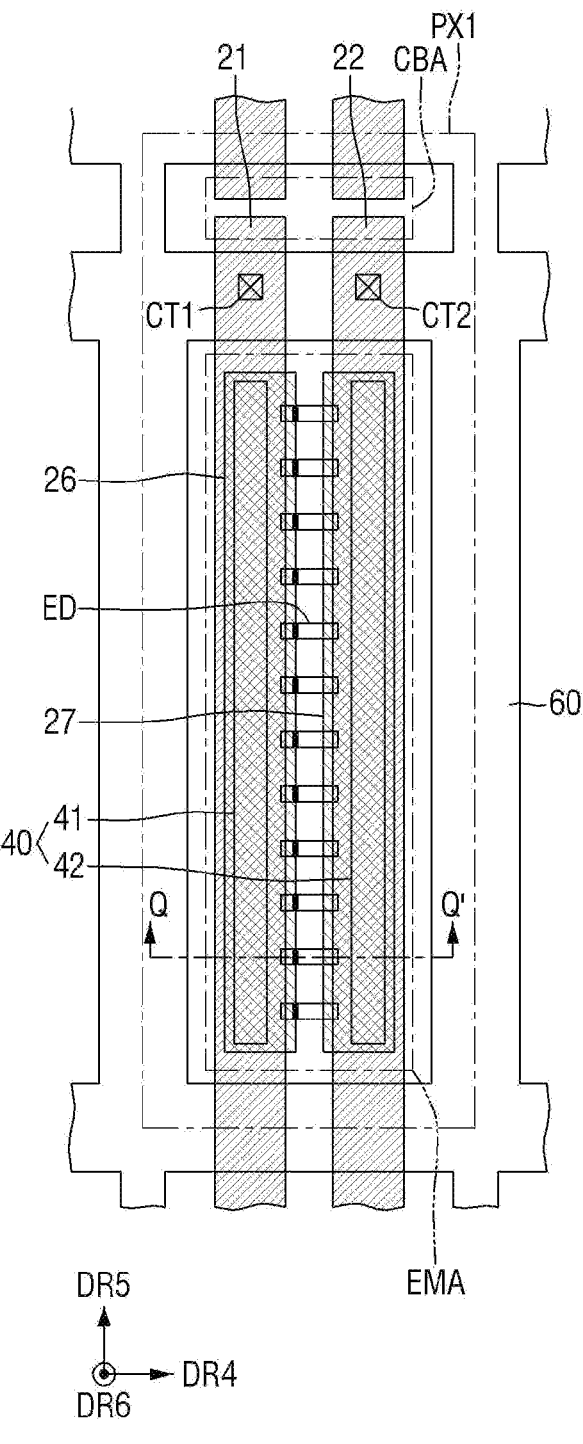
FIG. 28 is a plan view of a pixel of the display device according to one or more embodiments.
Figure 29:
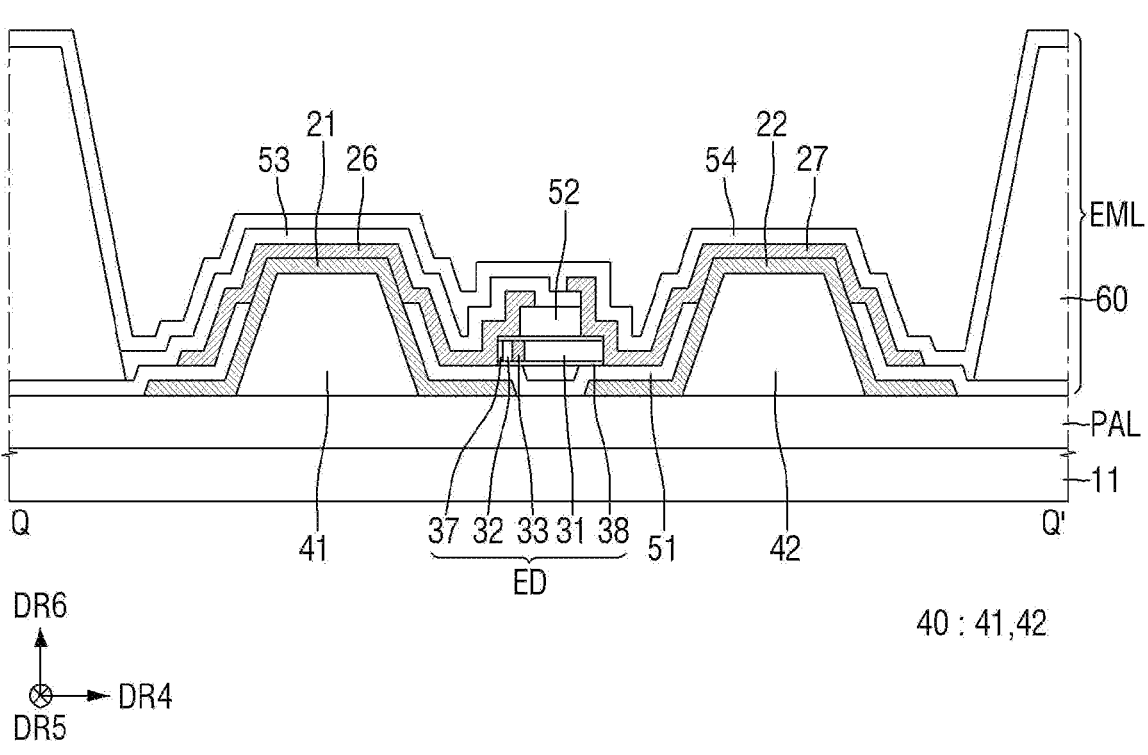
FIG. 29 is a cross-sectional view taken along the line Q-Q' of FIG. 28.

FIG. 28 is a plan view of a pixel of the display device according to one or more embodiments. FIG. 29 is a cross-sectional view taken along the line Q-Q' of FIG. 28.

Referring to FIG. 28, each pixel PX of the display device 10 may include an emission area EMA and a non-emission area. The emission area EMA may be defined as an area from which light emitted from the light emitting elements ED is output, and the non-emission area may be defined as an area from which no light is output because light emitted from the light emitting elements ED does not reach this area.

The emission area EMA may include an area in which the light emitting elements ED are disposed and an area which is adjacent to the above area. In addition, the emission area may further include an area from which light emitted from the light emitting elements ED is output after being reflected or refracted by other members.

Each pixel PX may further include a cut area CBA disposed in the non-emission area. The cut area CBA may be disposed on a side of the emission area EMA in the fifth direction DR5. The cut area CBA may be disposed between the emission areas EMA of the pixels PX neighboring each other in the fifth direction DR5.

The cut area CBA may be an area in which electrodes 21 and 22 included in the pixels PX neighboring each other along the fifth direction DR5 are separated from each other. The electrodes 21 and 22 disposed in the pixels PX may be separated from each other in the cut area CBA, and a portion of each of the electrodes 21 and 22 disposed in each pixel SPX may be disposed in the cut area CBA.

Referring to FIGS. 28 and 29, the display device 10 may include a first substrate 11, a circuit element layer PAL disposed on the first substrate 11, and a light emitting layer EML disposed on the circuit element layer PAL. The light emitting layer EML may include first and second electrodes 21 and 22, first and second contact electrodes 26 and 27, a first bank 40, a second bank 60, a plurality of insulating layers 51 through 54, and the light emitting elements ED.

The first substrate 11 may be an insulating substrate. The first substrate 11 may be made of an insulating material such as glass, quartz, or polymer resin. The substrate 11 may be a rigid substrate, but may also be a flexible substrate that can be bent, folded, and/or rolled.

The circuit element layer PAL may be disposed on the first substrate 11. The circuit element layer PAL may include at least one transistor to drive the light emitting layer EML.

The first bank 40 may extend in the fifth direction DR5 within each pixel PX in a plan view. The first bank 40 may include first and second sub-banks 41 and 42 spaced from each other. A space formed between the first and second sub-banks 41 and 42 that are spaced from each other may provide an area in which a plurality of light emitting elements ED are disposed.

At least a portion of each of the first and second sub-banks 41 and 42 may protrude from an upper surface of the first substrate 11. The protruding portion of each of the first and second sub-banks 41 and 42 may have inclined side surfaces and may change the direction of light travelling toward the side surfaces of the first and second sub-banks 41 and 42 after being emitted from the light emitting elements ED to an upward direction (e.g., a display direction, e.g., the sixth direction DR6).

The first and second electrodes 21 and 22 may be disposed on the first and second sub-banks 41 and 42, respectively. The first and second electrodes 21 and 22 may be spaced from each other.

Each of the first electrode 21 and the second electrode 22 may include a shape extending in the fifth direction DR5 in a plan view. The first electrode 21 and the second electrode 22 may be spaced from each other in the fourth direction DR4 to oppose each other.

The first electrode 21 may extend in the fifth direction DR5 to overlap a portion of the second bank 60 that extends in the fourth direction DR4. The first electrode 21 may be electrically connected to the circuit element layer PAL through a first contact hole CT1.

The second electrode 22 may extend in the fifth direction DR5 to overlap a portion of the second bank 60 that extends in the fourth direction DR4. The second electrode 22 may be electrically connected to the circuit element layer PAL through a second contact hole CT2.

The first and second electrodes 21 and 22 may each be electrically connected to the light emitting elements ED, and a suitable voltage (e.g., a predetermined voltage) may be applied to each of the first and second electrodes 21 and 22 so that the light emitting elements ED can emit light. For example, the electrodes 21 and 22 may be electrically connected to the light emitting elements ED between the first electrode 21 and the second electrode 22 through the contact electrodes 26 and 27 to be described later and may transmit electrical signals, which are transmitted to the electrodes 21 and 22, to the light emitting elements ED through the contact electrodes 26 and 27.

A first insulating layer 51 may be disposed on the electrodes 21 and 22. The first insulating layer 51 may be disposed on the first electrode 21 and the second electrode 22 to at least partially expose the first electrode and the second electrode 22. The first insulating layer 51 may protect the first electrode 21 and the second electrode 22 while insulating them from each other. In addition, the first insulating layer 51 may prevent direct contact of the light emitting elements ED on the first insulating layer 51 with other members, and thus, prevent damage to the light emitting elements ED.

The second bank 60 may be disposed on the first insulating layer 51. The second bank 60 may be disposed in a grid pattern including portions extending in the fourth direction DR4 and the fifth direction DR5 in a plan view. The second bank 60 may be formed to have a greater height than the first bank 40 in the sixth direction DR6. In a printing process for placing the light emitting elements ED during the manufacturing process of the display device 10, ink in which the light emitting elements ED are dispersed may be sprayed into an area defined by the second bank 60. The second bank 60 may prevent the ink from overflowing to adjacent pixels PX in the printing process.

When the light emitting elements ED included in the ink sprayed through the inkjet printing process have defects, the light emission reliability of the display device 10 may be reduced. Therefore, after the light emitting elements ED are formed on the base substrate 1100, if optical characteristics of the light emitting elements ED are inspected using the above-described optical inspection device 1, defective light emitting elements ED can be removed. Accordingly, this can reduce the number of defective light emitting elements ED in the display device 10, thus improving the reliability of the display device 10.

The light emitting elements ED may be disposed on the first insulating layer 51 between the electrodes 21 and 22. The light emitting elements ED may extend in a direction. In addition, the light emitting elements ED may extend in a direction, and the direction in which each electrode 21 or 22 extends and the direction in which the light emitting elements ED extend may be substantially perpendicular to each other.

A second insulating layer 52 may be disposed on a portion of each light emitting element ED disposed between the first electrode 21 and the second electrode 22. The second insulating layer 52 may partially cover outer surfaces (e.g., outer peripheral or circumferential surfaces) of the light emitting elements ED. The second insulating layer 52 may be disposed on the light emitting elements ED but may expose both ends of each of the light emitting elements ED. The second insulating layer 52 may protect the light emitting elements ED while anchoring the light emitting elements ED in the manufacturing process of the display device 10.

The first and second contact electrodes 26 and 27 may be disposed on the second insulating layer 52. The first and second contact electrodes 26 and 27 may extend in a direction in a plan view. Each of the first contact electrode 26 and the second contact electrode 27 may extend in the fifth direction DR5. The first contact electrode 26 and the second contact electrode 27 may be spaced from each other in the fourth direction DR4 to oppose each other.

The first and second contact electrodes 26 and 27 may contact the light emitting elements ED and the electrodes 21 and 22, respectively. The first contact electrode 26 may be disposed on the first electrode 21, and the second contact electrode 27 may be disposed on the second electrode 22. The first contact electrode 26 and the second contact electrode 27 may respectively contact an end and the other end of each light emitting element ED while partially covering upper surfaces of the first electrode 21 and the second electrode 22.

One end of each light emitting element ED exposed by the second insulating layer 52 may be electrically connected to the first electrode 21 through the first contact electrode 26, and the other end may be electrically connected to the second electrode 22 through the second contact electrode 27.

A third insulating layer 53 may be disposed on the first contact electrode 26. The third insulating layer 53 may electrically insulate the first contact electrode 26 and the second contact electrode 27 from each other. The third insulating layer 53 may cover the first contact electrode 26, but may not be disposed on the other end of each light emitting element ED so that the light emitting elements ED can contact the second contact electrode 27.

The second contact electrode 27 is disposed on the second electrode 22, the second insulating layer 52, and the third insulating layer 53. The second contact electrode 27 may contact the other end of each light emitting element ED and the exposed upper surface of the second electrode 22. The other end of each light emitting element ED may be electrically connected to the second electrode 22 through the second contact electrode 27.

A fourth insulating layer 54 may be disposed on the entire surface of the first substrate 11. The fourth insulating layer 54 may function to protect the members disposed on the first substrate 11 from an external environment.

The invention claimed is:

1. An optical inspection device comprising:
an optical measurement unit;
a first probe spaced from the optical measurement unit and configured to supply a first voltage;
a base frame under the optical measurement unit and spaced from the first probe; and
a second probe on a surface of the base frame proximate the first probe, the base frame being interposed between the optical measurement unit and the second probe, the second probe being configured to supply a second voltage different from the first voltage, and having a plate shape in a plan view.

2. The optical inspection device of claim 1, wherein the base frame is located closer to the optical measurement unit than the first probe is, the base frame comprising a transparent material.

3. The optical inspection device of claim 2, wherein the base frame comprises a transparent elastomer.

4. The optical inspection device of claim 3, further comprising a sensor unit configured to sense deformation of the base frame.

5. The optical inspection device of claim 2, wherein the base frame comprises a transparent glass substrate.

6. The optical inspection device of claim 2, wherein the second probe comprises a transparent conductive material.

7. The optical inspection device of claim 6, wherein the second probe comprises a plurality of sub-probes spaced from each other.

8. The optical inspection device of claim 2, further comprising:
a first probe driver configured to drive the first probe; and
a second probe driver configured to drive the second probe.

9. The optical inspection device of claim 8, further comprising:
a stage under the second probe and configured to have an object to be inspected placed on a surface facing the second probe; and
a distance measurement unit configured to measure a distance between the object to be inspected and the second probe.

10. The optical inspection device of claim 9, further comprising a temperature control unit under the stage.

11. The optical inspection device of claim 9, wherein the object to be inspected comprises a light emitting element structure comprising:
a base substrate;
a first semiconductor connection layer on the base substrate; and
a plurality of light emitting elements on the first semiconductor connection layer,
wherein the first probe is configured to contact the first semiconductor connection layer, and the second probe is configured to contact an end surface of at least one of the plurality of light emitting elements.

12. The optical inspection device of claim 1, wherein the second probe comprises a conductive elastomer.

13. The optical inspection device of claim 12, further comprising a sensor unit configured to measure a resistance of the second probe.

14. An optical inspection method of a light emitting element structure using an optical measurement unit, the light emitting element structure comprising a base substrate, a first semiconductor connection layer on the base substrate, and a plurality of light emitting elements on the first semiconductor connection layer and spaced from each other, the method comprising:
bringing a first probe in contact with the first semiconductor connection layer and bringing a second probe in contact with an end surface of at least one of the plurality of light emitting elements;
transmitting electrical signals to the first probe and the second probe; and
inspecting light emitted from the at least one of the plurality of light emitting elements,
wherein the second probe is on a surface of a base frame proximate the first probe, the base frame being interposed between the optical measurement unit and the second probe.

15. The optical inspection method of claim 14, wherein each of the plurality of light emitting elements comprises:
a first semiconductor layer protruding from the first semiconductor connection layer;
a second semiconductor layer spaced from the first semiconductor layer; and
a light emitting layer interposed between the first semiconductor layer and the second semiconductor layer, wherein the first semiconductor layer, the light emitting layer, and the second semiconductor layer are sequentially stacked in a direction perpendicular to a surface of the base substrate.

16. The optical inspection method of claim 14, wherein a first probe driver is configured to move the first probe to contact the first semiconductor connection layer, and a second probe driver is configured to move the second probe to contact the end surface of the at least one of the plurality of light emitting elements.

17. The optical inspection method of claim 16, wherein the bringing of the second probe into contact with the end surface of the at least one of the plurality of light emitting elements comprises:

moving the second probe using the second probe driver;

determining whether the second probe is in contact with the end surface of the at least one of the plurality of light emitting elements; and stopping the movement of the second probe in case that it is determined that the second probe is in contact with the end surface of the at least one of the plurality of light emitting elements.

18. The optical inspection method of claim 17, wherein the determining of whether the second probe is in contact with the end surface of the at least one of the light emitting elements is performed using a distance measurement unit, and wherein the distance measurement unit is configured to measure a distance between the second probe and the end surface of the at least one of the light emitting elements.

19. The optical inspection method of claim 17, wherein the second probe comprises a conductive elastomer, and the determining of whether the second probe is in contact with the end surface of the at least one of the plurality of light emitting elements is performed using a sensor unit configured to sense pressure applied to the second probe.

20. The optical inspection method of claim 16, wherein the second probe has a plate shape in a plan view, and wherein the bringing of the second probe to contact with the end surface of the at least one of the plurality of light emitting elements comprises placing the second probe to cover the end surface of the at least one of the plurality of light emitting elements.

* * * * *